(12) United States Patent
Yang et al.

(10) Patent No.: US 11,581,425 B2
(45) Date of Patent: Feb. 14, 2023

(54) METHOD FOR MANUFACTURING SEMICONDUCTOR STRUCTURE WITH ENLARGED VOLUMES OF SOURCE-DRAIN REGIONS

(71) Applicant: TAIWAN SEMICONDUCTOR MANUFACTURING COMPANY, LTD., Hsinchu (TW)

(72) Inventors: Tsung-Hsi Yang, Hsinchu (TW); Che-Yu Lin, Hsinchu (TW); Yi-Fang Pai, Hsinchu (TW); Pei-Ren Jeng, Hsinchu (TW); Chii-Horng Li, Hsinchu (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 16 days.

(21) Appl. No.: 17/198,683

(22) Filed: Mar. 11, 2021

(65) Prior Publication Data
US 2022/0293773 A1 Sep. 15, 2022

(51) Int. Cl.
| H01L 29/66 | (2006.01) |
| H01L 21/3105 | (2006.01) |
| H01L 21/8234 | (2006.01) |
| H01L 21/02 | (2006.01) |
| H01L 21/8238 | (2006.01) |

(52) U.S. Cl.
CPC .. *H01L 29/66795* (2013.01); *H01L 21/02337* (2013.01); *H01L 21/02351* (2013.01); *H01L 21/31055* (2013.01); *H01L 21/823431* (2013.01); *H01L 21/823468* (2013.01); *H01L 21/823814* (2013.01); *H01L 29/6656* (2013.01); *H01L 29/66636* (2013.01)

(58) Field of Classification Search
CPC ............. H01L 29/66795; H01L 29/785; H01L 27/0886; H01L 21/823431; H01L 21/02337; H01L 29/66636
See application file for complete search history.

(56) References Cited

U.S. PATENT DOCUMENTS

| 2015/0091059 A1* | 4/2015 | Hung | .................... | H01L 29/785 |
| | | | | 257/192 |
| 2020/0176319 A1* | 6/2020 | Lin | .................. | H01L 21/02057 |

* cited by examiner

*Primary Examiner* — Tuan A Hoang
(74) *Attorney, Agent, or Firm* — Birch, Stewart, Kolasch & Birch, LLP

(57) ABSTRACT

A method for smoothing a surface of a semiconductor portion is disclosed. In the method, an intentional oxide layer is formed on the surface of the semiconductor portion, a treated layer is formed in the semiconductor portion and inwardly of the intentional oxide layer, and then, the intentional oxide layer and the treated layer are removed to obtain a smoothed surface. The method may also be used for widening a recess in a manufacturing process for a semiconductor structure.

20 Claims, 23 Drawing Sheets

METHOD FOR MANUFACTURING SEMICONDUCTOR STRUCTURE WITH ENLARGED VOLUMES OF SOURCE-DRAIN REGIONS

BACKGROUND

In a method for manufacturing a fin-type filed effect transistor (FinFET) device, a gate stack and gate spacers are formed on a portion of a semiconductor fin, exposed portions of the semiconductor fin are etched to form recesses, and source-drain regions are regrown in the recesses. The dimensions and profiles (including, e.g., but not limited to, surface roughness) of the recesses may affect the performance of the FinFET device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
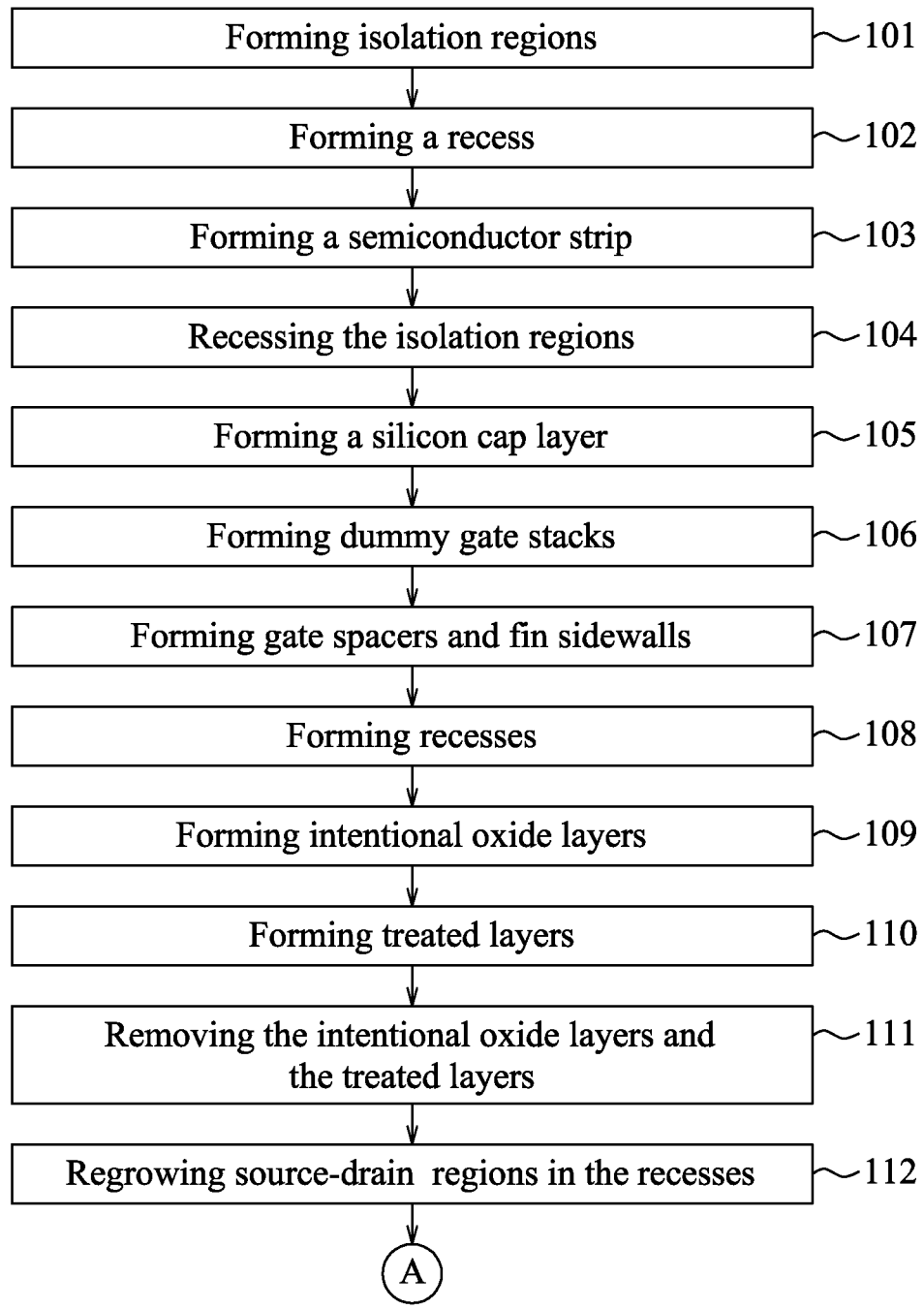
FIGS. 1A and 1B are flow diagrams illustrating a method for manufacturing a semiconductor structure with enlarged volumes of source-drain regions in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "lower," "higher," "above," "over," "outer," "inner," "inwardly," "forwardly," "rearwardly," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
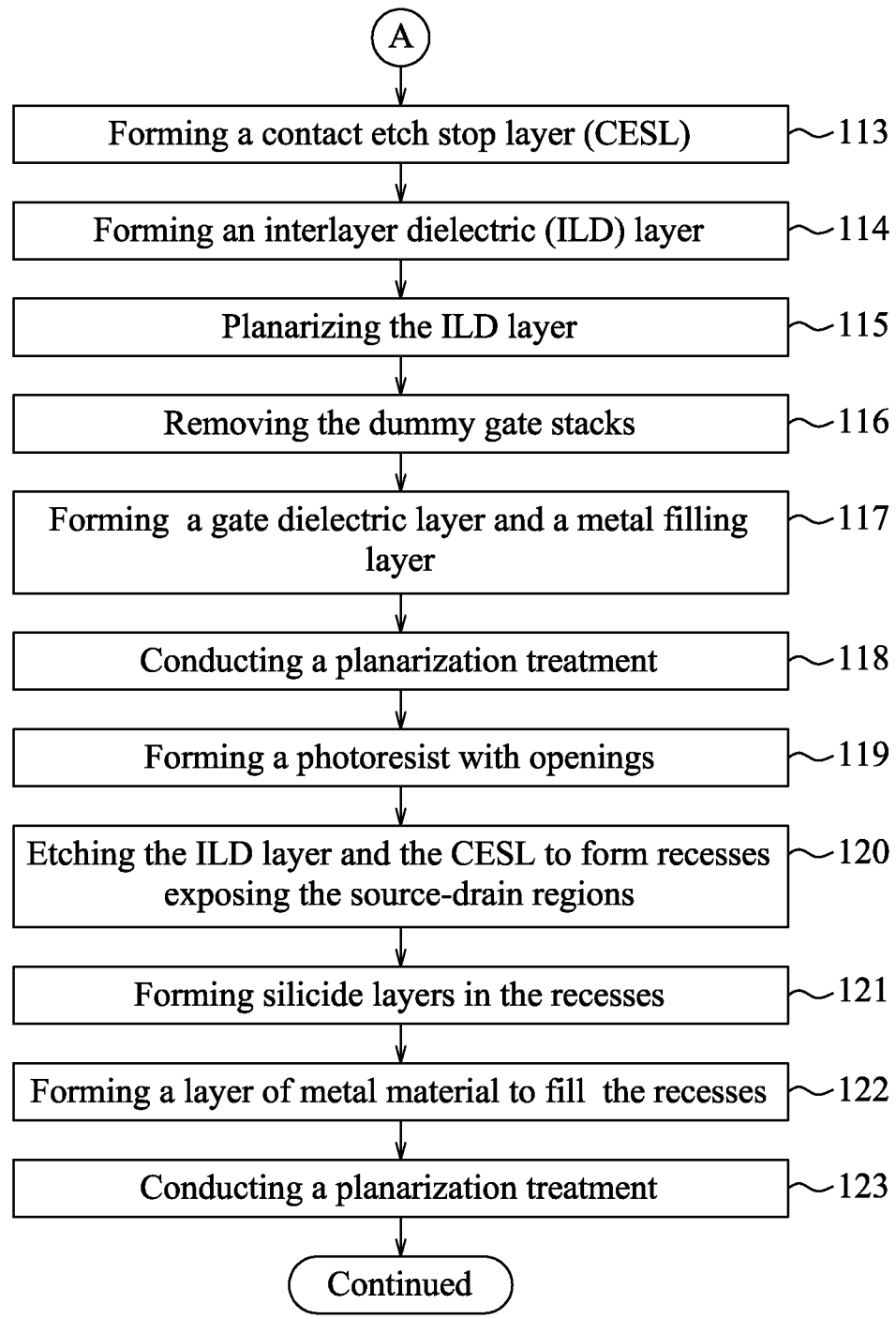
Figure 2:
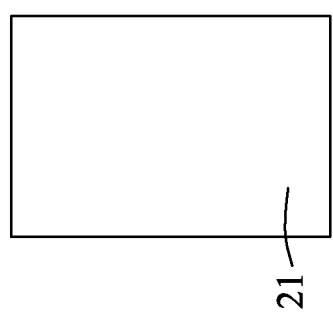

FIGS. 1A and 1B are flow diagrams illustrating a method 100 for manufacturing a semiconductor structure in accordance with some embodiments. The semiconductor structure may be, for example, but not limited to, fin-type filed effect transistor (FinFET) devices, nano-sheet transistor devices, nano-wire transistor devices, and other suitable devices. FIGS. 2 to 38 illustrate schematic views of the intermediate stages of the method 100. FIG. 2 illustrates a schematic side view of a semiconductor substrate 21. The semiconductor substrate 21 may be, for example, but not limited to, a part of a wafer, or a silicon substrate, a silicon carbon substrate, or a substrate made of other semiconductor material. The semiconductor substrate 21 may be non-doped or lightly-doped with a p-type or an n-type impurity.

Figure 3:
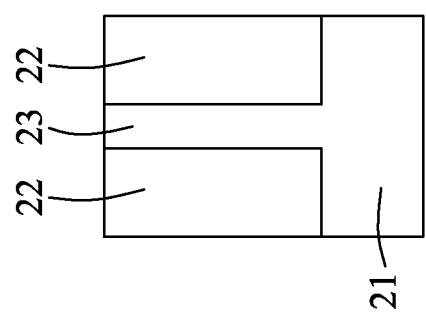

Referring to FIGS. 1A and 3, the method 100 begins at step 101, where isolation regions 22 are formed in the semiconductor substrate 21, and a semiconductor strip 23 is defined between the isolation regions 22. The isolation regions 22 may be shallow trench isolation (STI) regions, and may be formed by etching the semiconductor substrate 21 to form a plurality of trenches (not shown), and filling the trenches with a dielectric material to form the STI regions 22. The dielectric material for forming the STI regions 22 may include, for example, but not limited to, silicon oxide, silicon nitride, silicon oxynitride, high dielectric constant (k) materials, other suitable materials, or combinations thereof.

Figure 4:
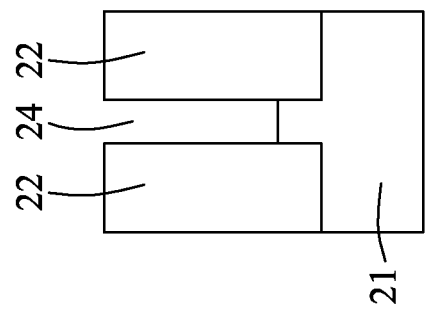
FIGS. 2 to 38 are schematic perspective and cross-sectional views illustrating intermediate stages of the method for manufacturing the semiconductor structure in accordance with some embodiments as depicted in FIGS. 1A and 1B.

Referring to FIGS. 1A and 4, the method 100 proceeds to step 102, where top portions or entire portions of the semiconductor strip 23 shown in FIG. 3 are removed to form a recess 24. A recess bottom of the recess 24 may be leveled with, higher than, or lower than a bottom surface of the STI regions 22.

Figure 5:
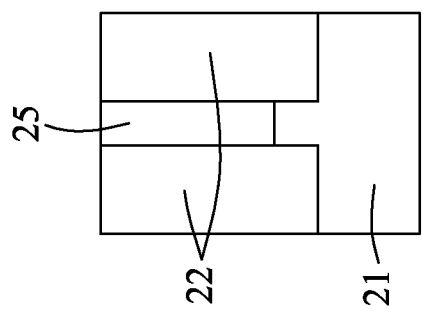

Referring to FIGS. 1A and 5, the method 100 proceeds to step 103, where a semiconductor strip 25 may be grown in the recess 24 shown in FIG. 4 through a selective epitaxial process. The semiconductor strip 25 may include, for example, but not limited to, silicon (Si), silicon germanium (SiGe), silicon boride (SiB), other suitable materials, or combinations thereof.

Figure 6:
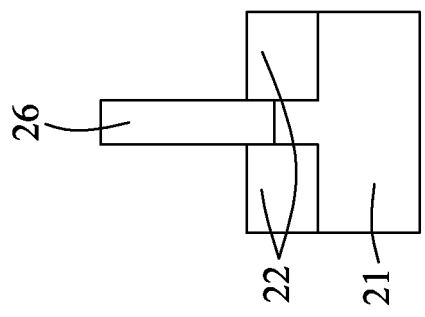

Referring to FIGS. 1A and 6, the method 100 proceeds to step 104, where the isolation regions (i.e., the STI regions) 22 are recessed. The recessing of the STI regions 22 may be implemented by, for example, but not limited to, etching, other suitable methods, or combinations thereof. A part of the semiconductor strip 25 (see FIG. 5) above the STI regions 22 may be referred to as a semiconductor fin 26. In alternative embodiments, the steps 102 and 103 may be skipped, and the semiconductor fin 26 may be formed from the semiconductor strip 23 shown in FIG. 3 and may have the same material as the semiconductor substrate 21.

Figure 7:
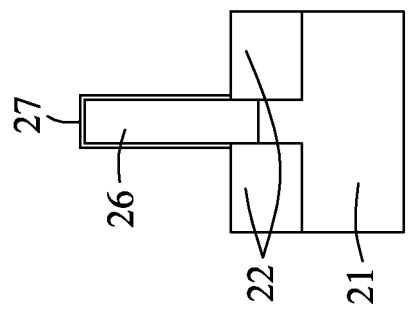
Figure 8:
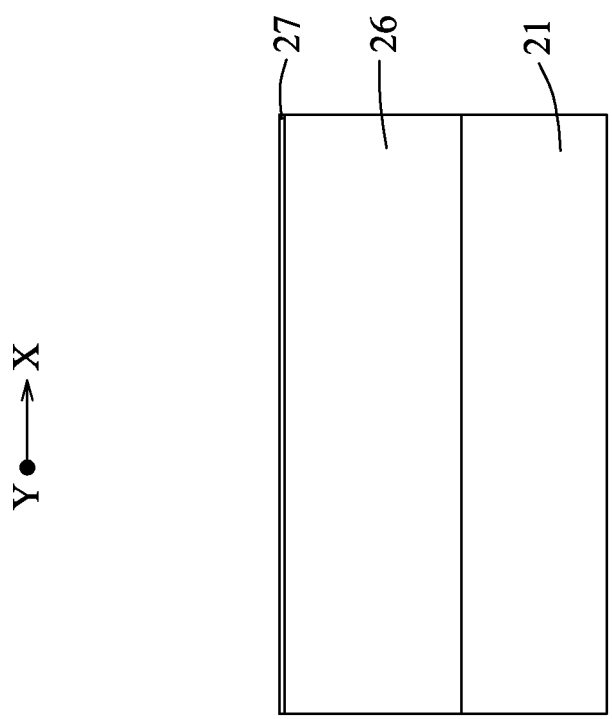

Referring to FIGS. 1A and 7, the method 100 proceeds to step 105, where a silicon cap layer 27 is formed on the semiconductor fin 26. In some embodiments, the silicon cap layer 27 may be formed through epitaxy and may include, for example, but not limited to, crystalline silicon, other suitable materials, or combinations thereof. FIG. 7 is a cross-sectional view taken in a width direction (i.e., a Y direction) of the semiconductor fin 26, illustrating the semiconductor fin 26 obtained in step 105, and FIG. 8 is a cross-sectional view taken in a length direction (i.e., an X direction), illustrating the semiconductor fin 26 obtained in step 105. In alternative embodiments, step 105 may be skipped.

Figure 9:
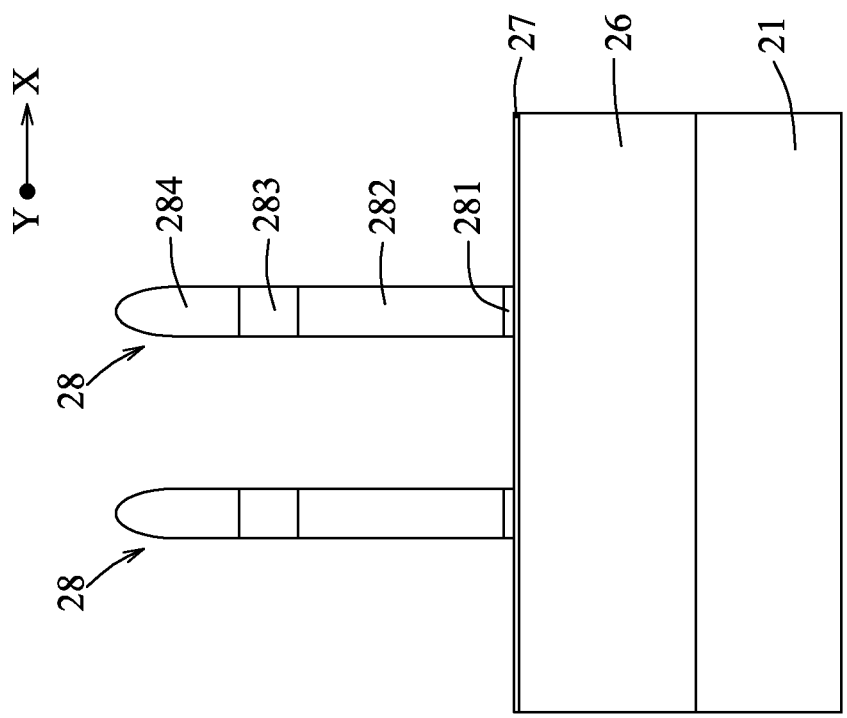
Figure 10:
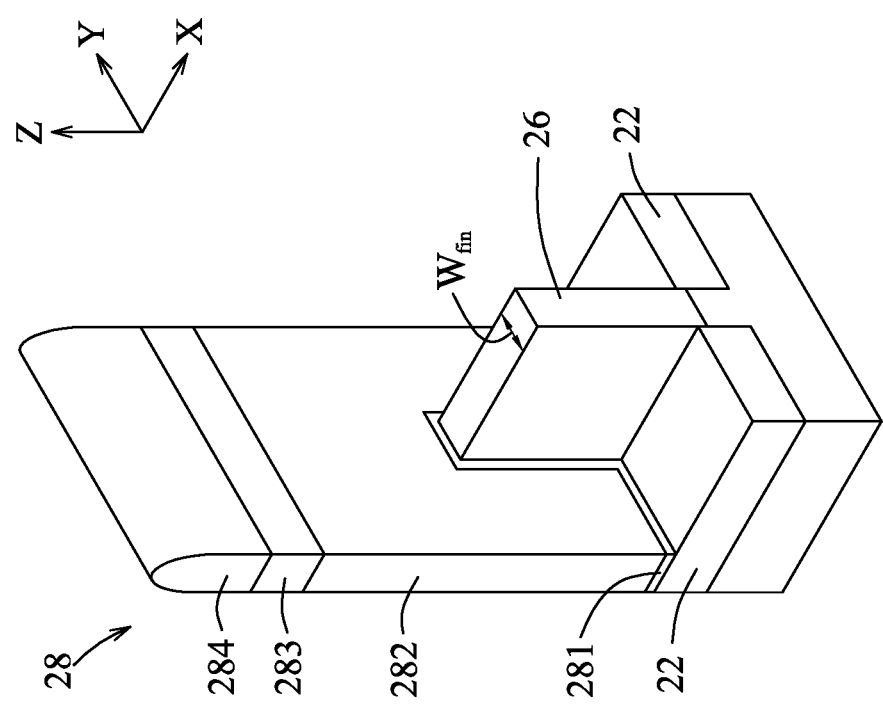

Referring to FIGS. 1A and 9, the method 100 proceeds to step 106, where two dummy gate stacks 28 are formed over two portions of the semiconductor fin 26. Each of the dummy gate stacks 28 may extend in the Y direction, and may include a dummy gate dielectric 281, a dummy gate electrode 282, a polish-stop layer 283, and a hard mask layer 284. Each of the gate stacks 28 may be formed by depositing a layer of gate dielectric material (not shown), a layer of gate electrode material (not shown), a layer of polish-stop material (not shown), and a layer of hard mask material (not shown), followed by a lithography process and an etching process to form the dummy gate dielectric 281, the dummy gate electrode 282, the polish-stop layer 283, and the hard mask layer 284. The gate dielectric material may include, for example, but not limited to, silicon oxide, silicon nitride, silicon oxynitride, high dielectric constant (k) materials, other suitable materials, or combinations thereof. The gate electrode material may include, for example, but not limited to, polycrystalline silicon, single crystalline silicon, amorphous silicon, other suitable materials, or combinations thereof. The polish-stop material may include, for example, but not limited to, silicon nitride (e.g., SiN), silicon oxide, other nitrides, other oxides, other suitable materials, or combinations thereof. The hard mask material may include, for example, but not limited to, silicon nitride, silicon oxide, silicon oxynitride, other suitable materials, or combinations thereof. FIG. 10 is a schematic perspective view illustrating one of the gate stacks 28 and a portion of the semiconductor fin 26 obtained in step 106. In FIG. 10, "$W_{fin}$" represents the width of the semiconductor fin 26 in the Y direction. In addition, the silicon cap layer 27 shown in FIG. 9 is omitted in FIG. 10 for clarity.

Figure 11:
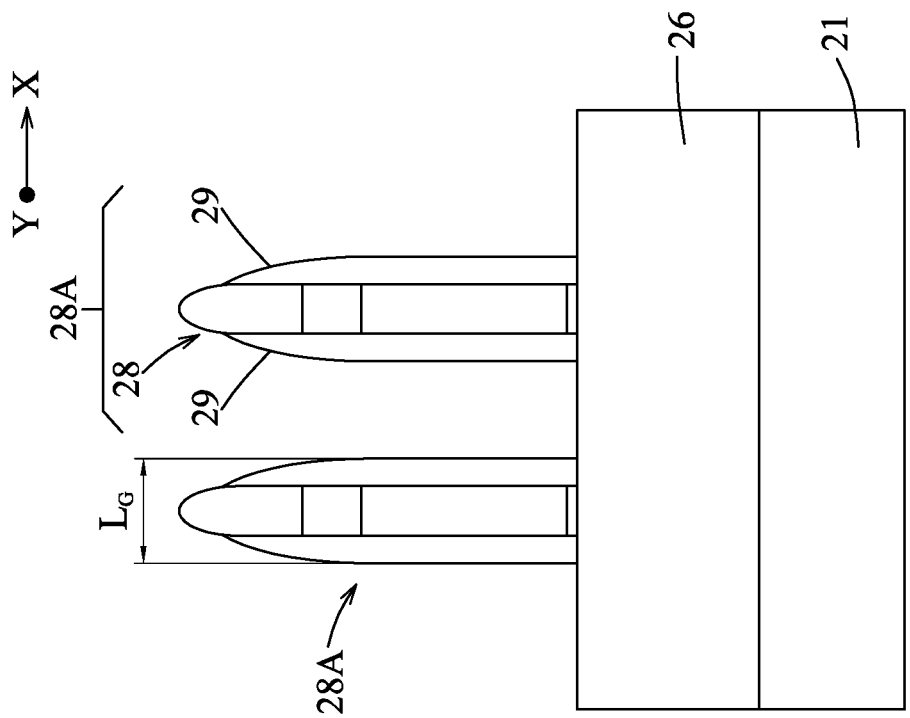
Figure 12:
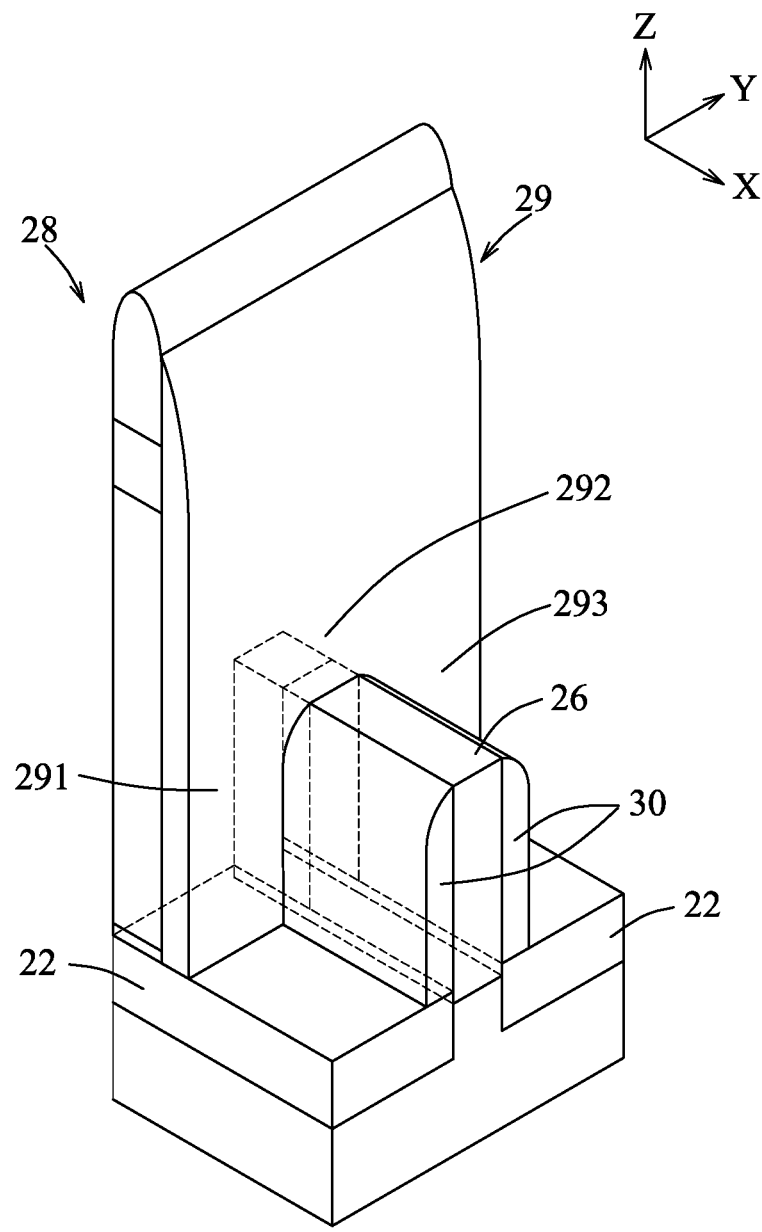
Figure 13:
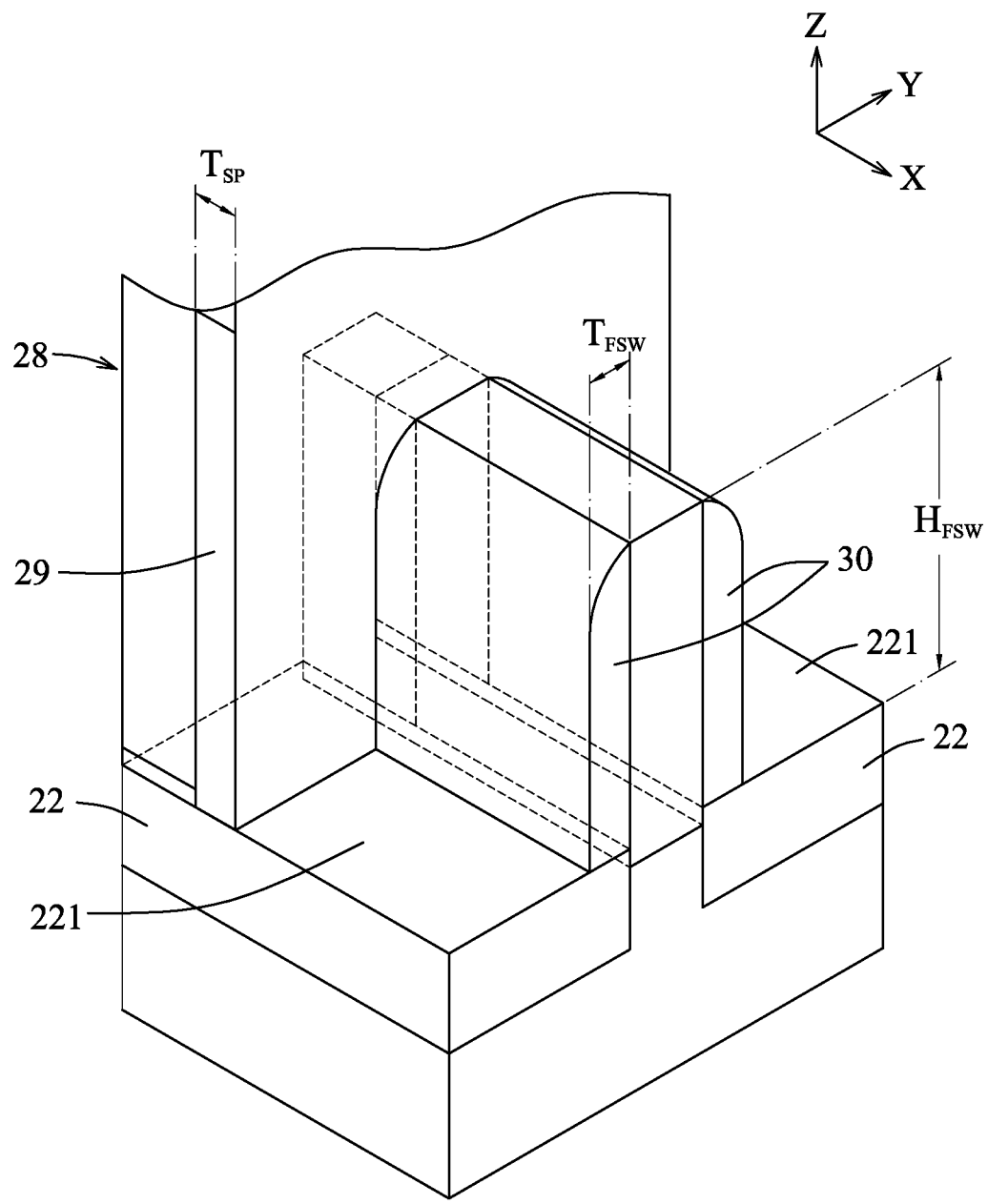
Figure 14:
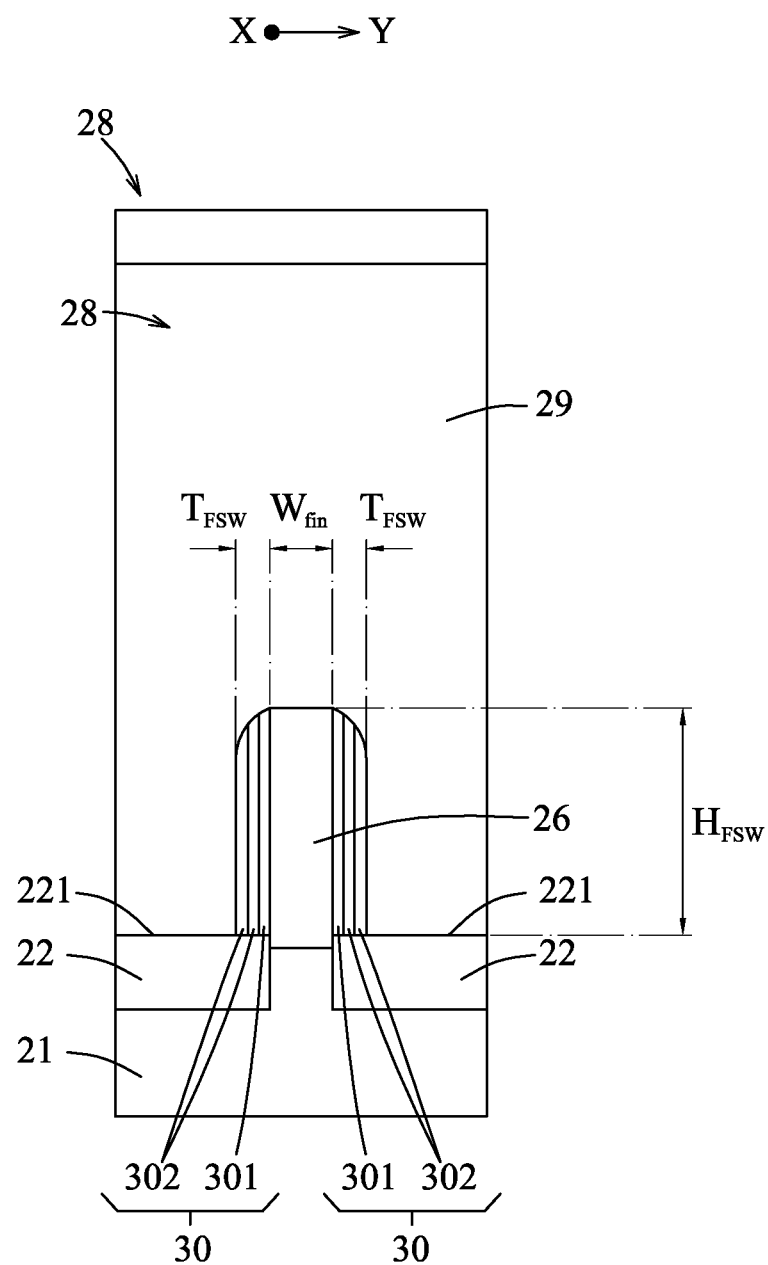

Referring to FIGS. 1A and 11, the method 100 proceeds to step 107, where two gate spacers 29 are respectively formed at two opposite sides of each of the gate stacks 28, and two fin sidewalls 30 (not shown in FIG. 11 but shown in FIG. 12) are respectively formed at two opposite sides of each exposed portion of the semiconductor fin 26. Each of the gate stacks 28 and two corresponding ones of the gate spacers 29 together form a gate structure 28A having a length ($L_G$) in the X direction. In FIG. 11, the silicon cap layer 27 shown in FIG. 9 is omitted for clarity. FIG. 12 is similar to FIG. 10 but illustrates a portion of the semiconductor structure obtained in step 107, in which one of the gate spacers 29 and the two fin sidewalls 30 are further shown. Each of the gate spacers 29 (only one is shown in FIG. 12) may include a first portion 291 disposed forwardly of the semiconductor fin 26 in the Y direction, a second portion 292 disposed above the semiconductor fin 26, and a third portion 293 disposed rearwardly of the semiconductor fin 26 in the Y direction. FIG. 13 is a partially enlarged view of FIG. 12. FIG. 14 is a schematic cross-sectional view of FIG. 12 taken in the Y direction.

The gate spacers 29 and the fin sidewalls 30 may be formed simultaneously by, for example, but not limited to, blanket deposition of a spacer-forming layer (not shown) over the gate stacks 28, the semiconductor fin 26, and the STI regions 22 exposed from the gate stacks 28, followed by anisotropically etching to permit the spacer-forming layer to be left on two opposite sides of each of the gate stacks 28 to form the gate spacers 29, and to be left on two opposite sides of each exposed region of the semiconductor fin 26 to form the fin sidewalls 30. The spacer-forming layer may include one or more material layers. In some embodiments, each of the fin sidewalls 30, as shown in FIG. 14, may include an inner sidewall layer 301 and one or more outer sidewall layers 302 which may be made of a different material from that of the inner sidewall layer 301. The inner sidewall layer 301 may include, for example, but not limited to, a silicon carbon-containing material, a silicon oxide-containing material, other suitable materials, or combinations thereof, and the outer sidewall layer(s) 302 may include, for example, but not limited to, silicon nitride, other suitable materials, or combinations thereof. In FIGS. 13 and 14, "$T_{SP}$" represents a thickness of the gate spacer 29 in the X direction, "$H_{FSW}$" represents a height of each of the fin sidewalls 30 above top surfaces 221 (Z=0) of the STI regions 22 in a Z direction, and "$T_{FSW}$" represents a thickness of each of the fin sidewalls 30 in the Y direction.

Figure 16:
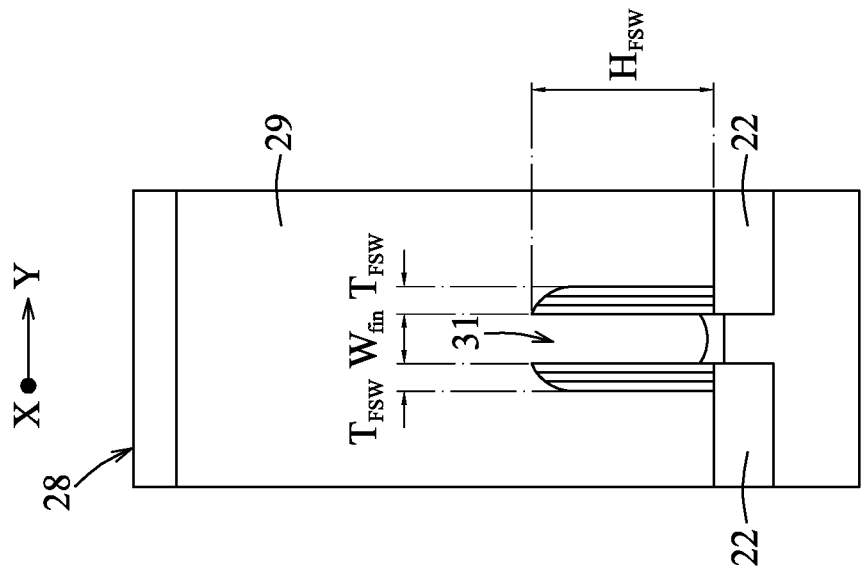
Figure 15:
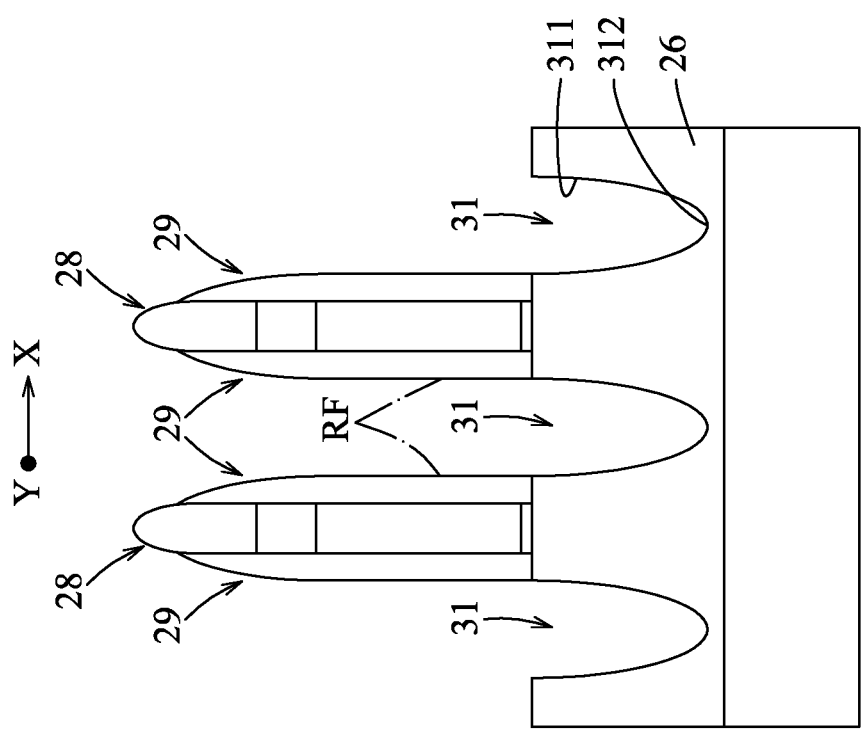
Figure 17:
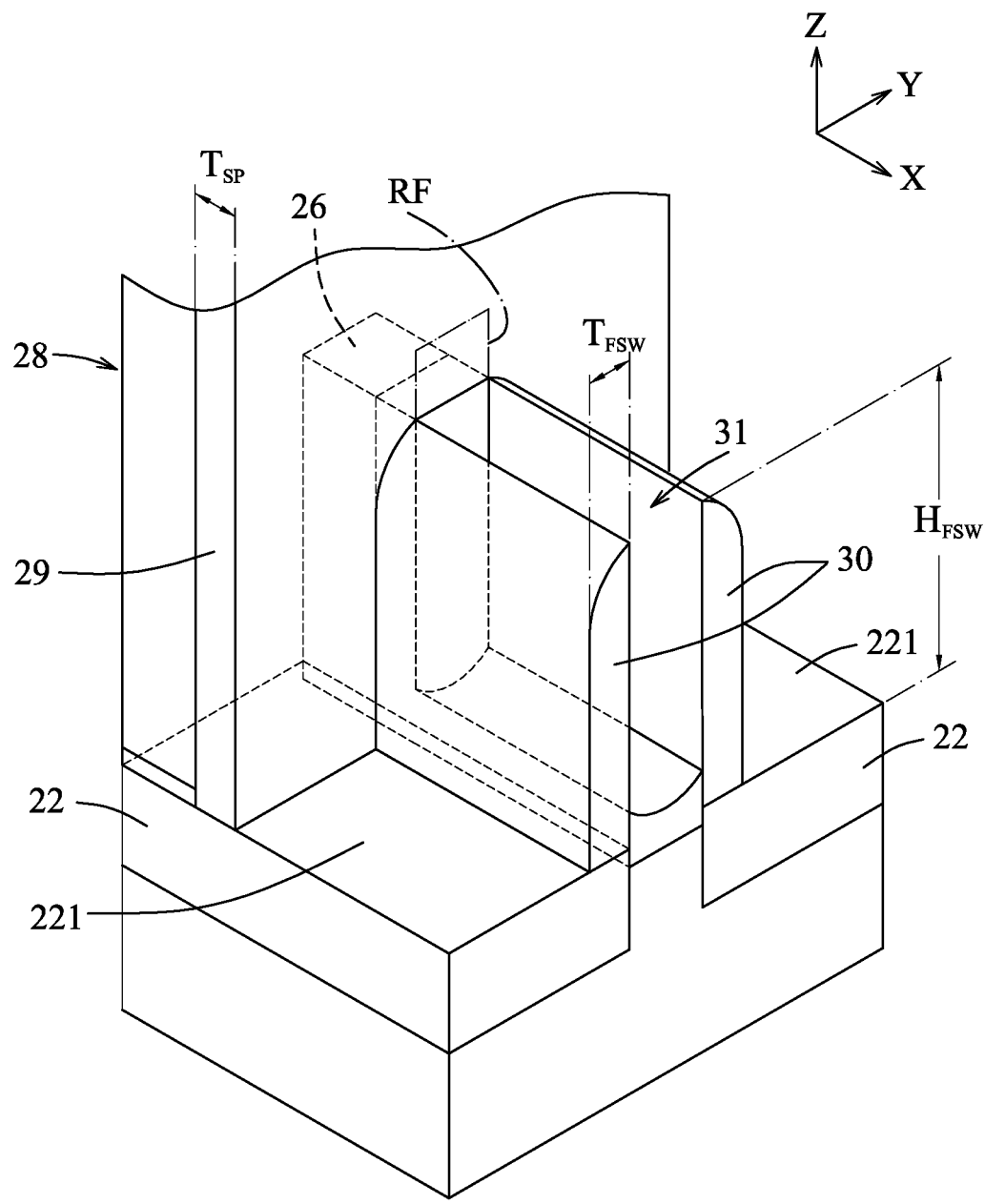

Referring to FIGS. 1A and 15, the method proceeds to step 108, where recesses 31 are etched into the semiconductor fin 26 at positions exposed from the gate stacks 28 and the gate spacers 29. FIG. 16 is a schematic cross-sectional view similar to FIG. 14 but illustrating one of the recesses 31 obtained in step 108. FIG. 17 is similar to FIG. 13 but further illustrates the one of the recesses 31 formed in step 108. In FIGS. 15 and 17, a reference plane (RP) defined by an outer surface of each of the gate spacers 29 is shown. After step 108, each of the recesses 31 extending in the X direction may reach to the reference plane (RF), and each of the recesses 31 may have a width in the Y direction substantially the same as the width ($W_{fin}$) of the semiconductor fin 26.

As shown in FIG. 15, each of the recesses 31 may have a (110) surface 311 (i.e. with a (110) crystal orientation) on an inner peripheral wall thereof and a (100) surface 312 (i.e. with a (100) crystal orientation) on a bottom wall thereof. Step 108 may be implemented through a known etching process in the art, such as, but not limited to, a dry etching process, a wet etching process, other suitable processes, or combinations thereof. After step 108, some particles (not shown; which may include carbon, oxide, or other possible materials, and may serve as micro-masks) may remain on the surfaces 311, 312 of the recesses 31.

Figure 19:
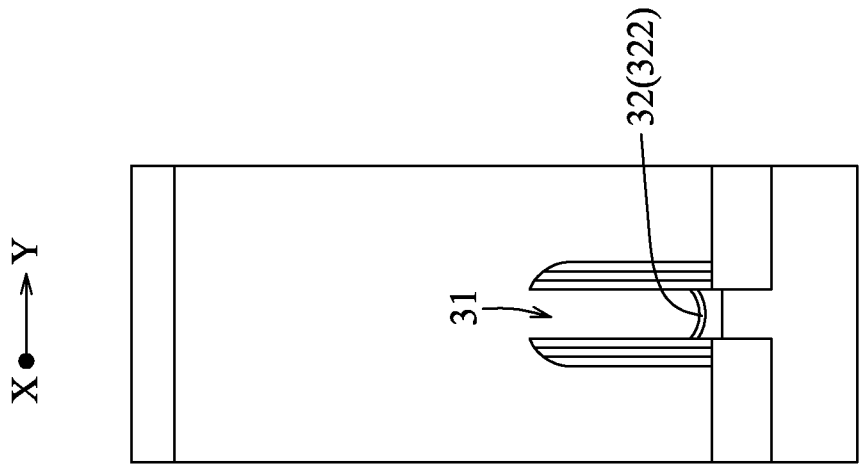
Figure 18:
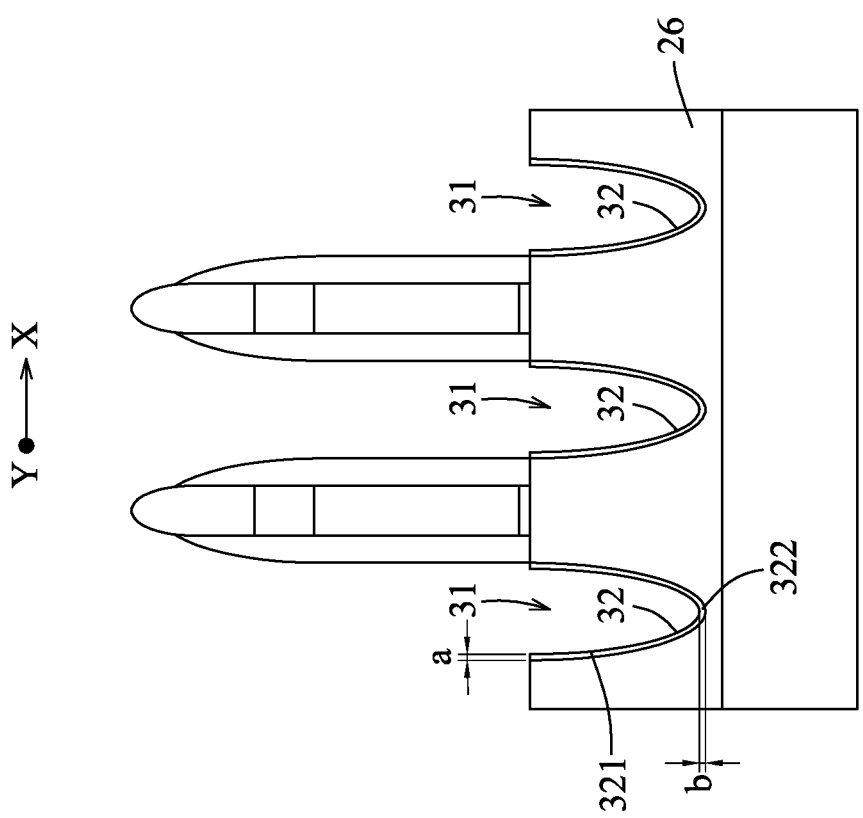

Referring to FIGS. 1A, and 18, the method proceeds to step 109, where intentional oxide layers 32 are respectively formed in or on interior surfaces of the recesses 31 (i.e., the surfaces 311, 312 of the recesses 31 shown in FIG. 15). FIG. 19 is similar to FIG. 16 but illustrates formation of the intentional oxide layer 32 in the one of the recesses 31 after step 109. Each of the intentional oxide layers 32 may have a (110) portion 321 in position corresponding to the surface 311 shown in FIG. 15 and a (100) portion 322 in position corresponding to the surface 312 shown in FIG. 15. The intentional oxide layers 32 may include, for example, but not limited to, silicon oxide, silicon germanium oxide, silicon carbon oxide, other suitable materials, or combinations thereof. As shown in FIG. 18, the (110) portion 321 may have a thickness (a), and the (100) portion 322 may have a thickness (b). The thickness (a) or (b) may be about or less than 10 Å although the thickness (a) or (b) may be slightly larger than 10 Å, depending on a process for forming the intentional oxide layers 32. In some embodiments, the intentional oxide layers 32 may be formed by oxidation of the surfaces 311, 312 of the recesses 31 shown in FIG. 15, and the non-shown micro-masks remaining on the surfaces 311, 312 of the recesses 31 in step 108 may be parts of the intentional oxide layers 32 after step 109. In alternative embodiments, the intentional oxide layers 32 may be formed by deposition, and the non-shown micro-masks may be covered by the intentional oxide layers 32.

The intentional oxide layers 32 may be formed using, for example, but not limited to, a native oxidation process, an oxygen treatment process, an ozone treatment process, a chemical oxidation process, a thermal chemical vapor deposition process, a thermal oxidation process, other suitable processes, or combinations thereof. The native oxidation process may be implemented by allowing the semiconductor structure obtained in step 108 to stand for a time period (for example, but not limited to, four to five hours or other suitable time periods) to permit the exposed surfaces 311, 312 of the recesses 31 shown in FIG. 15 to react with ambient moisture, thereby forming the intentional oxide layers 32. The oxygen or ozone treatment may be implemented by introducing oxygen or ozone after step 108 to permit formation of the intentional oxide layers 32. The chemical oxidation process may be implemented by introducing an oxidizing reagent to permit oxidation of the exposed surfaces 311, 312 of the recesses 31 to thereby form the intentional oxidation layers 32. The thermal chemical vapor deposition process may be implemented under a sub-atmospheric pressure (or other suitable pressures), using suitable materials including, for example, but not limited to, (i) tetraethyl orthosilicate (TEOS) or other suitable materials and (ii) ozone, oxygen, or other suitable oxidizing reagents, so as to form the intentional oxidation layers 32. The thermal oxidation process may be implemented by introducing a thermal vapor to oxidize the surfaces 311, 312 of the recesses 31. The thermal vapor may include a dry mixture, a wet mixture, or a combination thereof. The dry mixture may include, for example, but not limited to, oxygen, nitrogen, other suitable gases, or combinations thereof. The wet mixture may include, for example, but not limited to, oxygen, nitrogen, other suitable gases, water, a water vapor, a steam produced from reaction of hydrogen and oxygen, other suitable gases or vapors, or combinations thereof. The intentional oxide layers 32 formed by different processes may have different properties, such as, but not limited to, density.

Figure 21:
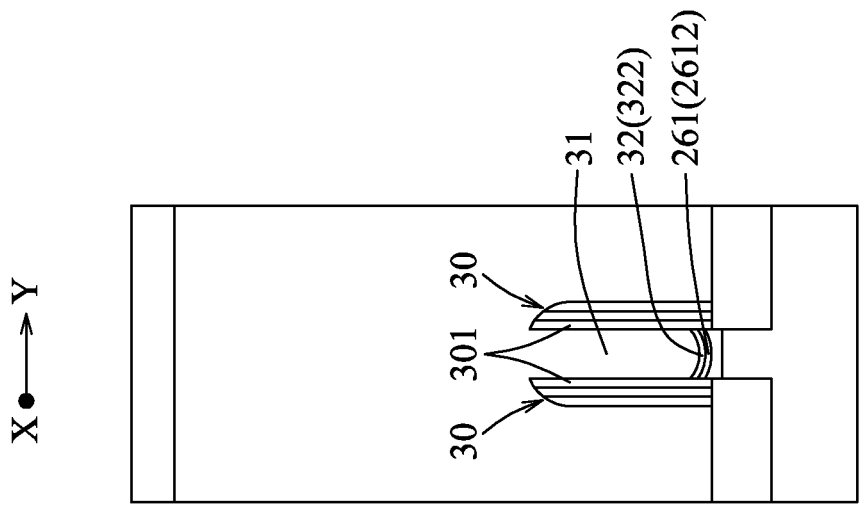
Figure 20:
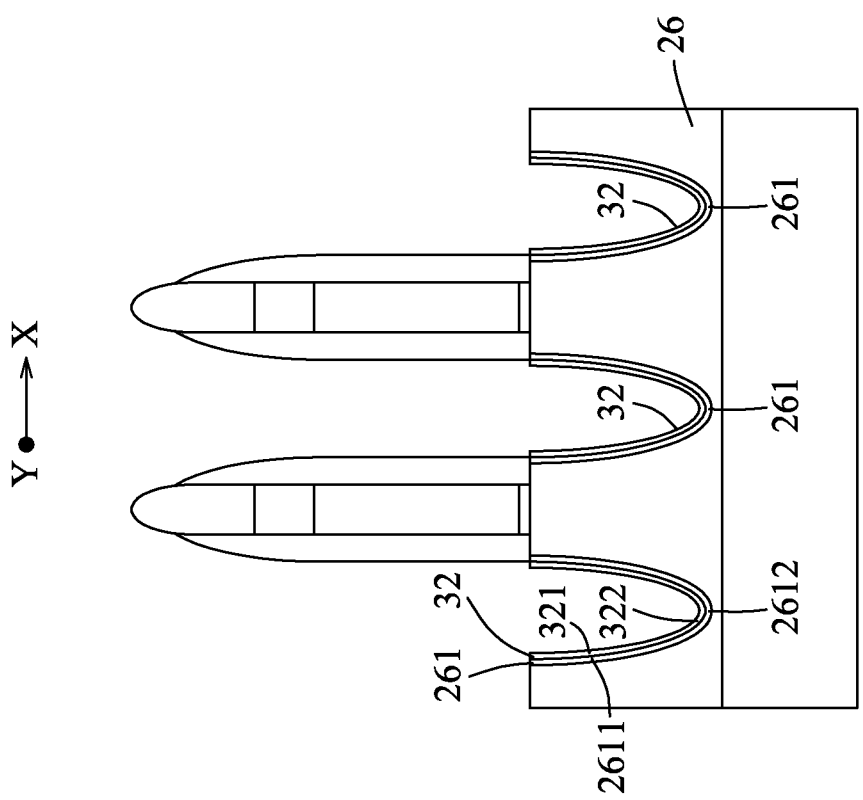

Referring to FIGS. 1A and 20, the method proceeds to step 110, where treated layers 261 are formed in the semiconductor fin 26 immediately interior of the intentional oxide layers 32. Step 110 may be implemented using a pre-epitaxial treatment (i.e., a free radical clean) to permit cleaning of the recesses 31 and to permit free radicals to penetrate through the intentional oxide layers 32 into the semiconductor fin 26 so as to break chemical bonds of the semiconductor fin 26 immediately interior of the intentional oxide layers 32, thereby forming the treated layers 261. First portions 2611 of the treated layers 261 are disposed inwardly of the (110) portions 321 of the intentional oxide layers 32, and second portions 2612 of the treated layers 261 are disposed inwardly of the (100) portion 322 of the intentional oxide layers 32. FIG. 21 is similar to FIG. 19 but illustrates the second portion 2612 of the treated layer 261 in the one of the recesses 31 formed in step 110.

In some embodiments, the free radicals may include, for example, but not limited to, hydrogen radicals, other suitable free radicals, or combinations thereof. The hydrogen radicals may be generated using a plasma generator, such as, but not limited to, a transformer-coupled plasma generator, an inductively coupled plasma system, a magnetically enhanced reactive ion etching system, an electron cyclotron resonance system, a remote plasma generator, or other suitable devices or systems. A gas source for generating the free radicals (i.e., a plasma) may include a treating gas (for example, but not limited to, a hydrogen gas, other suitable gases, or combinations thereof) and may optionally further include a carrier gas (for dilution the etching gas). The carrier gas may include, for example, but not limited to, a helium gas, an argon gas, other suitable gases, or combinations thereof. For generating the free radicals, a flow rate of the treating gas may be set in a range from about 10 sccm to about 2000 sccm, a flow rate of the carrier gas may be set in a range from about 50 sccm to about 6000 sccm, a process temperature may be set in a range from about 90° C. to about 600° C., and a process pressure may be set in a range from about 0.05 torr to about 6 torr. In alternative embodiments, a slightly higher or lower flow rate for each of the treating gas and the carrier gas, a higher or lower process temperature, or a slightly higher or lower process pressure may be used, depending on the design or the device performance of the semiconductor structure to be produced.

In alternative embodiments, the free radicals may be generated by heating a gas (for example, but not limited to, a hydrogen gas, other suitable gases, or combinations thereof) to decompose the gas molecules into atoms (i.e., free radicals).

Figure 22:
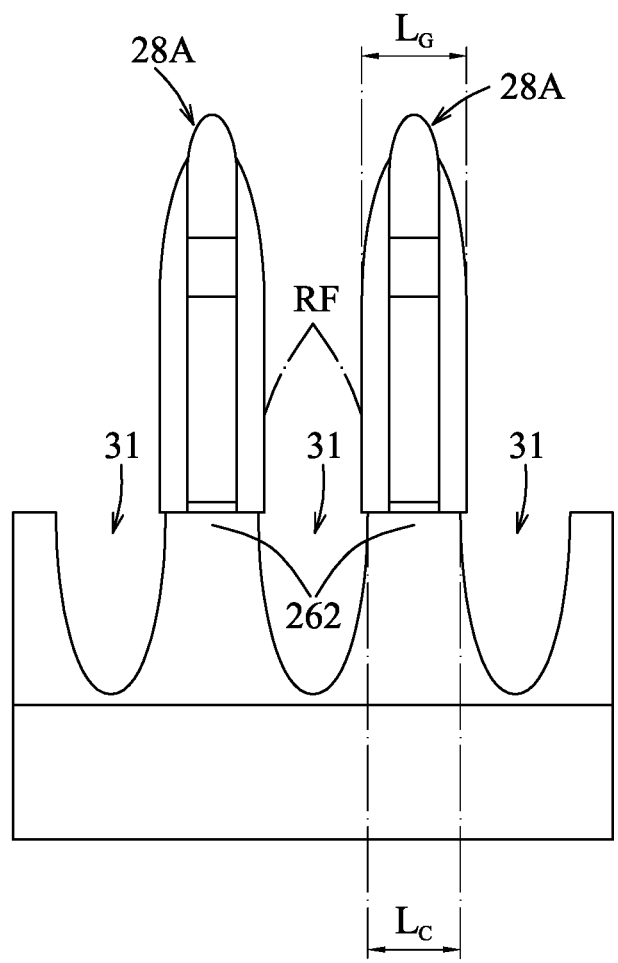
Figure 23:
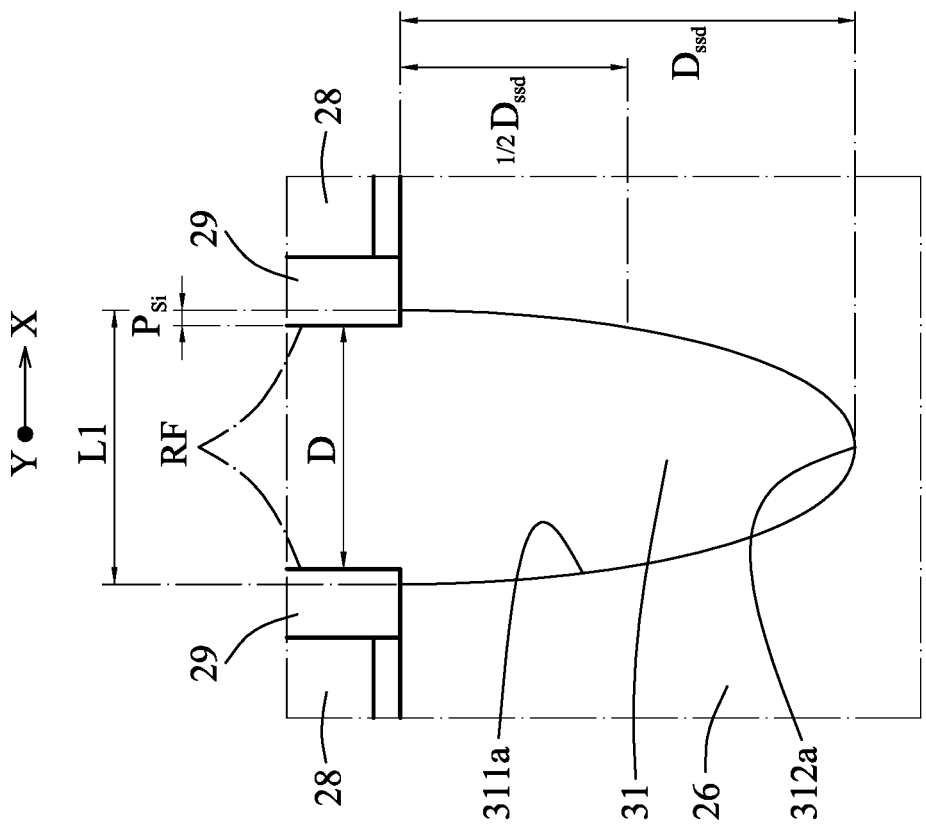
Figure 25:
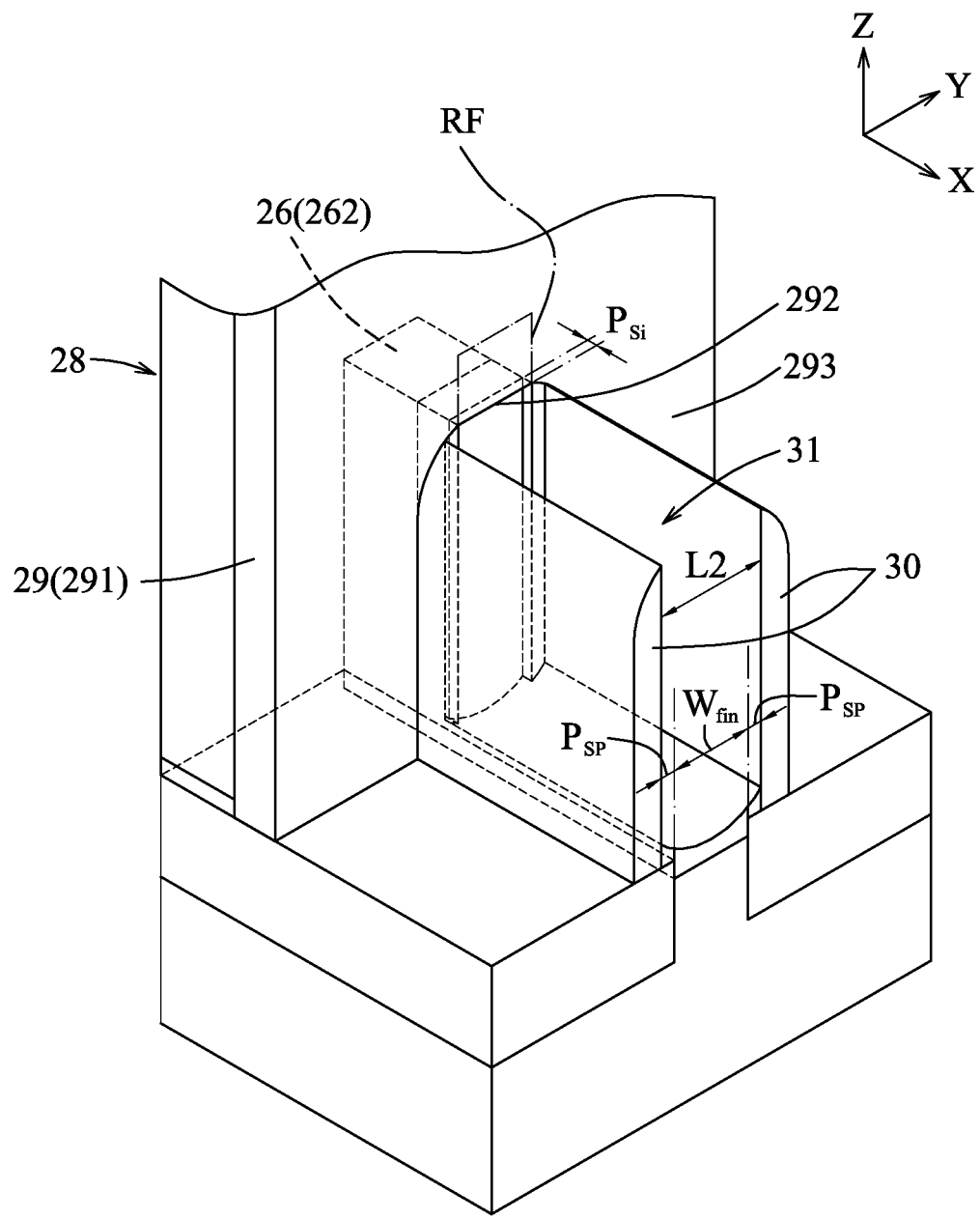
Figure 26:
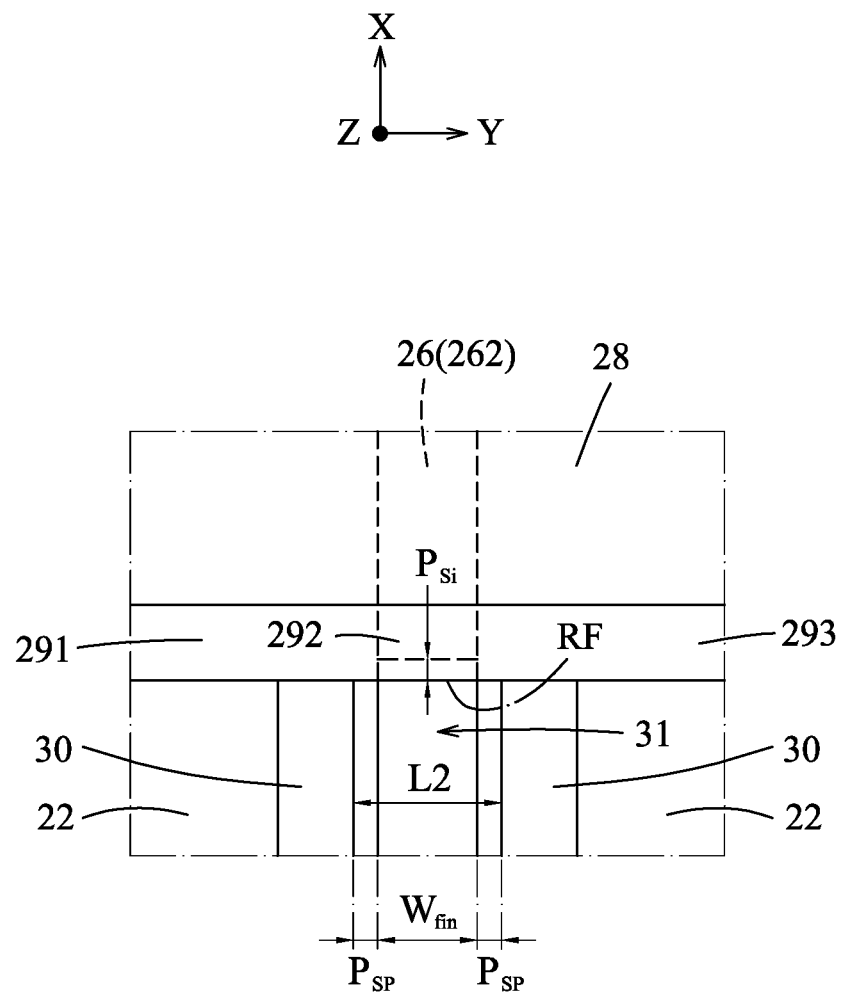

Referring to FIGS. 1A and 22 to 24, the method proceeds to step 111, where the intentional oxide layers 32 and the treated layers 261 of the semiconductor fin 26 shown in FIG. 20 are removed to achieve a "proximity push" effect, and the inner sidewall layers 301 of the fin sidewalls 30 (shown in FIG. 21) are at least partially removed to achieve a "sidewall push" effect. FIG. 23 is a partially enlarged view of FIG. 22 for more clearly illustrating the "proximity push" effect. FIG. 25 is similar to FIG. 17 but illustrates both the "proximity push" effect and the "sidewall push" effect in step 111. FIG. 26 is a top side view illustrating a portion of FIG. 25. After step 111, each of the recesses 31 has a depth ($D_{ssd}$) (see FIG. 23). The extent of the "proximity push" is represented by "$P_{Si}$" (see FIGS. 23, 25, and 26), i.e., each of the recesses 31 obtained in step 111 is widened in the X direction over the reference plane (RF) by a distance ($P_{Si}$) compared to each of the recesses 31 obtained in step 108 shown in FIG. 15. The extent of the "the sidewall push" is represented by "$P_{SP}$" (see FIGS. 24 to 26), i.e., each of the fin sidewalls 30 has a reduced thickness ($P_{SP}$) compared to FIGS. 13 and 14), and each of the recesses 31 is wider than the width ($W_{fin}$) of the semiconductor fin 26 in the Y direction by twice of the ($P_{SP}$). The extent of the "proximity push" ($P_{Si}$) at ($1/2\ D_{ssd}$) may range from about 0 nm to about 0.5 nm. The extent of the "sidewall push" ($P_{SP}$) at ($1/2\ H_{FSW}$) may range from about 0 nm to about 0.5 nm. In some embodiments, the extent of the "proximity push" ($P_{Si}$) at ($1/2\ D_{ssd}$) may be greater than about 0.1 nm, and the extent of the "sidewall push" ($P_{SP}$) at ($1/2\ H_{FSW}$) may be greater than about 0.1 nm. The extents of the "proximity push" and "sidewall push" may be controlled by varying the treating time in step 111.

Figure 24:
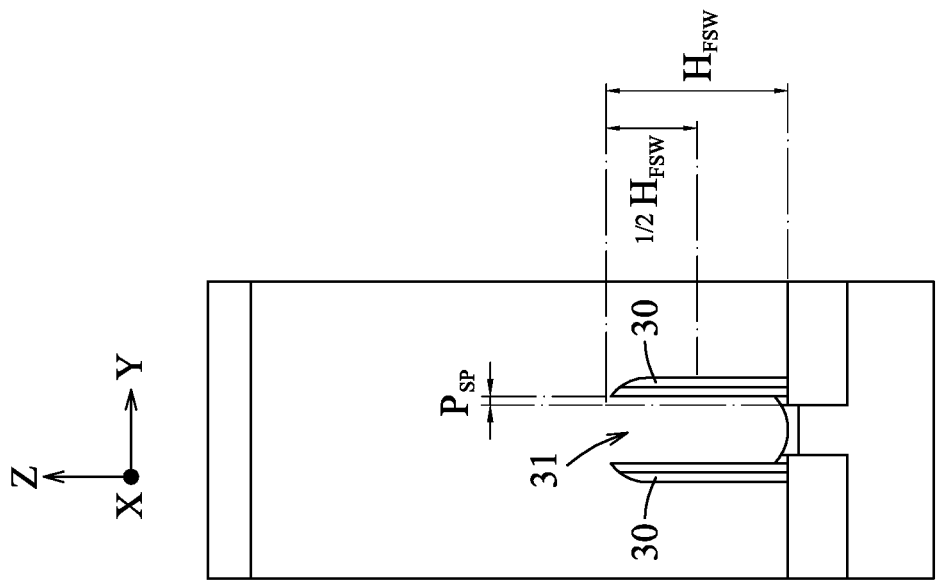

In more detail, because the treated layers 261 shown in FIGS. 20 and 21 are at least partially removed or fully removed whilst removing the intentional oxide layers 32 shown in FIGS. 20 and 21 in step 111, each of the recesses 31 obtained in step 111 is widened in the X direction to achieve the "proximity push" effect (see FIGS. 23, 25, and 26), and is also deepened in the Z direction (see FIGS. 21 and 24). As shown in FIG. 23, each of the recesses 31 after step 111 may have a largest dimension (L1) in the X direction. The largest dimension (L1) is larger than a shortest distance (D) between two adjacent spacers 29 in the X direction, and equals a sum of the shortest distance (D) and twice of the distance ($P_{Si}$). Furthermore, as shown in FIG. 22, a channel region 262 is defined between two adjacent ones of the recesses 31 and immediately beneath a corresponding one of the gate structures 28A. A channel length ($L_C$) of the channel region 262 in the X direction is smaller than the length ($L_G$) of a corresponding one of the gate structures 28A.

Moreover, because the inner sidewall layers 301 of the fin sidewalls 30 shown in FIG. 21 are at least partially removed or fully removed in step 111 (see FIGS. 24 to 26), each of the recesses 31 obtained in step 111 is widened in the Y direction to achieve the "sidewall push" effect. As shown in FIGS. 25 and 26, each of the recesses 31 after step 111 may have a largest dimension (L2) in the Y direction between the two fin sidewalls 30. The largest dimension (L2) is greater than a width of the channel region 262 in the Y direction (i.e., the width ($W_{fin}$) of the semiconductor fin 26), and equals a sum of the width ($W_{fin}$) of the semiconductor fin 26 and twice of the ($P_{SP}$). In view of the above, each of the recesses 31, after step 111, may have widen dimensions in both the X and Y directions, and hence may have an enlarged volume.

In addition, since the not-shown micro-masks may also be removed during removal of the treated layers 261 and the intentional oxide layers 32, each of the recesses 31 may have a smooth interior surface (i.e., a (110) surface 311a with a (110) crystal orientation and a (100) surface 312a with a (100) crystal orientation) shown in FIG. 24). The recesses 31 having smooth (110) surfaces 311a may allow the semiconductor structure obtained by the method 100 to have a reduced drain induced barrier lowering (DIBL). Besides, the smooth interior surfaces of the recesses 31 may facilitate the epitaxial growth in the recesses 31 in the following step 112, and thus, the semiconductor structure obtained by the method 100 may have an improved yield.

Step 111 may be implemented by, for example, but not limited to, an HF vapor etching, an $NH_3$ vapor etching, an $NH_3$ plasma etching, an $NF_3$ vapor etching, an $NF_3$ plasma etching, a wet etching using a diluted HF solution including HF and a solvent (for example, but not limited to, $H_2O$, isopropyl alcohol (IPA), methanol, ethanol, other suitable solvents, or combinations thereof), other suitable etchants, or combinations thereof. In some embodiments, step 109 may be implemented by, for example, but not limited to, a combination of the HF vapor etching and the $NH_3$ vapor etching, a combination of the HF vapor etching and the $NH_3$ plasma etching, a combination of the $NF_3$ vapor etching and the $NH_3$ vapor etching, a combination of the $NF_3$ vapor etching and the $NH_3$ plasma etching, a combination of the $NF_3$ plasma etching and the $NH_3$ plasma etching, other suitable etchants, or combinations thereof.

In alternative embodiments, steps 109 and 111 may be skipped. In this case, the non-shown micro-masks in each of the recesses 31 obtained in step 108 may be removed using, for example, but not limited to, a wet clean using dHF (i.e., diluted hydrofluoric acid), other suitable methods, or combinations thereof, and may be further removed using the free radicals in step 110. If the time for treating the recesses 31 using the free radicals is long enough, each of the recesses 31 may be widened in the X direction to achieve the "proximity push" effect.

In yet alternative embodiments, steps 109 to 111 may be used for smoothing a surface of a semiconductor portion, for example, but not limited to, a surface of a semiconductor substrate for epitaxial growing a semiconductor fin and so on.

Figure 27:
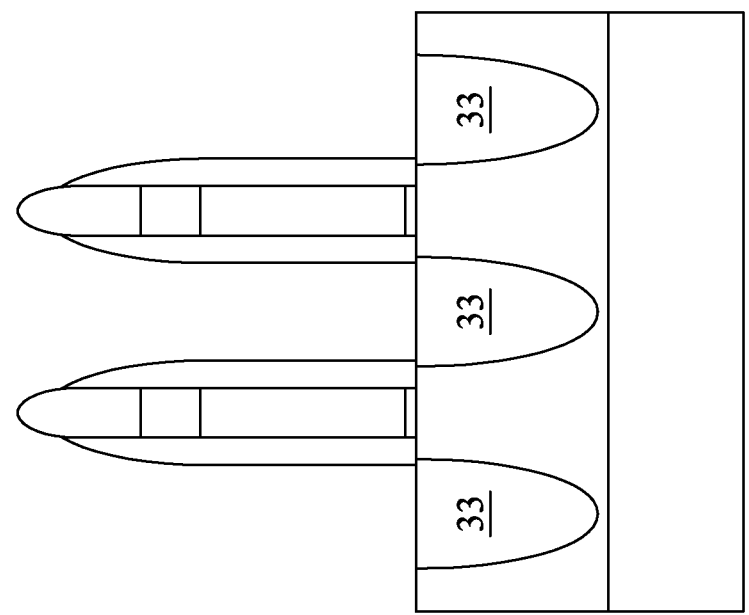

Referring to FIGS. 1A and 27, the method proceeds to step 112, where source-drain regions 33 are re-grown in the recesses 31 obtained in step 111 through, for example, but not limited to, a selective epitaxial growth (SEG) process, other suitable processes, or combinations thereof. The source-drain regions 33 may be, for example, but not limited to, polycrystalline silicon or other suitable materials in-situ doped with an n-type impurity or a p-type impurity during the SEG process. The n-type impurity may be, for example, but not limited to, phosphorous, nitrogen, arsenic, antimony, other suitable materials, or combinations thereof. The p-type impurity may be, for example, but not limited to, germanium, boron, aluminum, gallium, indium, $BF_2$, other suitable materials, or combinations thereof. To function as an n-FET of a FinFET, the n-type impurity may be, for example, but not limited to, phosphorous which may have a concentration ranging from 0 to about 1E21 atoms/$cm^3$, although other doping concentrations or other suitable n-type impurities may be used, depending on the design or the device performance of the n-type semiconductor device to be produced. To function as a p-FET of a FinFET, the p-type impurity may include, for example, but not limited to, germanium (which may have a concentration ranging from 0% to about 40%) and boron (which may have a concentration ranging from 0 to about 5E20 atoms/$cm^3$), although other doping concentrations and/or other suitable p-type impurities may be used, depending on the design or the device performance of the p-type semiconductor device to be produced. Because the recesses 31 obtained in step 111 may have widen dimensions in both the X and Y directions, the source-drain regions 33 may have enlarged volumes. In other words, the semiconductor structure obtained by the method 100 may have enlarged volumes of the source-drain regions 33, and thus have an improved drive current (DC).

Figure 28:
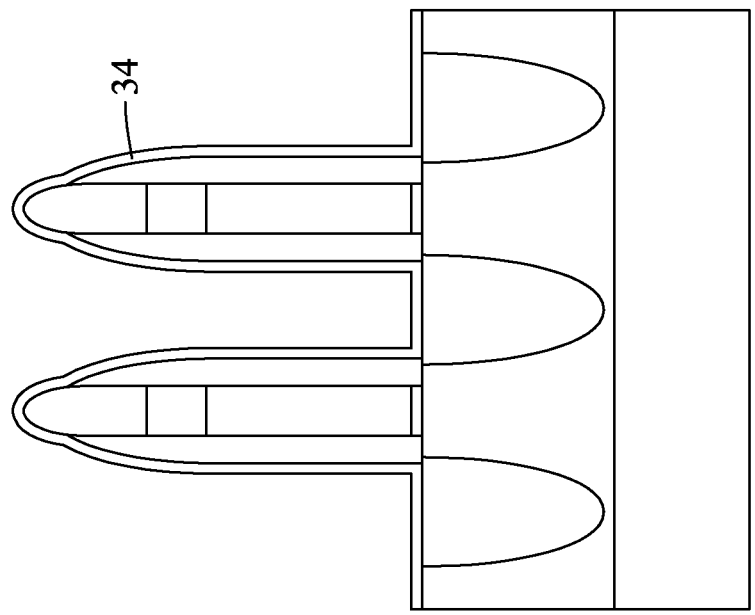

Referring to FIGS. 1B and 28, the method 100 proceeds to step 113, where a contact etch stop layer (CESL) 34 is formed over the semiconductor structure obtained in step 110. The CESL 34 may include, but not limited to, silicon nitride, carbon-doped silicon nitride, other suitable materials, or combinations thereof, and may be formed using a blanket deposition process, such as, but not limited to, chemical vapor deposition (CVD), high density plasma CVD (HDPCVD), sub-atmospheric CVD (SACVD), molecular layer deposition (MLD), other suitable methods, or combinations thereof.

Figures 29, 30:
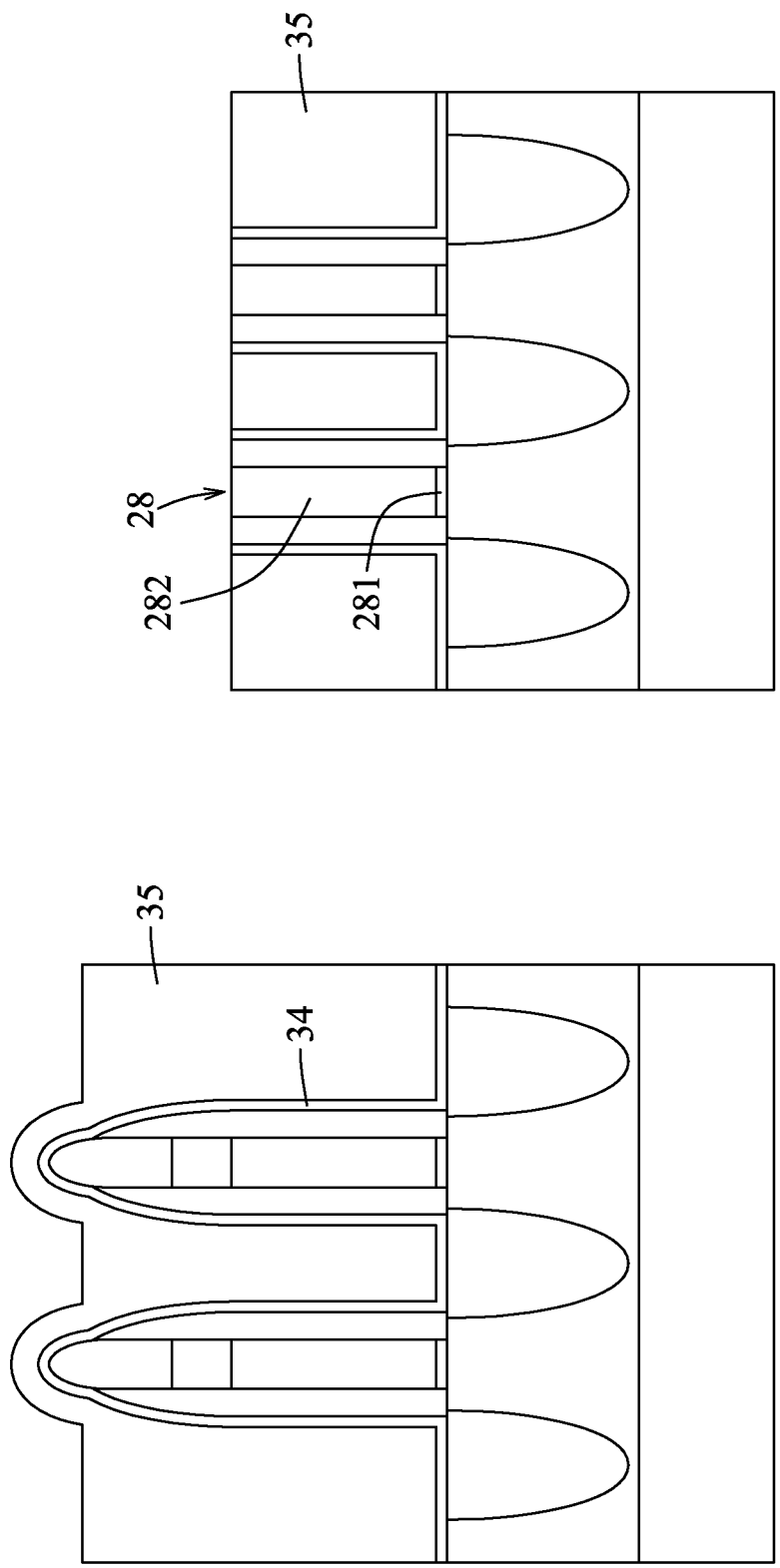

Referring to FIGS. 1B and 29, the method 100 proceeds to step 114, where an interlayer dielectric (ILD) layer 35 is formed over the CESL 34. The ILD layer 35 may include a dielectric material such as, but not limited to, silicon oxide, silicon nitride, silicon oxynitride, other suitable dielectric materials, or combinations thereof. The ILD layer 35 may be formed by blanket depositing a layer of the dielectric material using CVD, HDPCVD, SACVD, MLD, other suitable methods, or combinations thereof.

Referring to FIGS. 1B and 30, the method 100 proceeds to step 115, where the ILD layer 35 is planarized using, for example, but not limited to, chemical mechanical polishing (CMP), other suitable methods, or combinations thereof, to expose the dummy gate electrodes 282 of the dummy gate stacks 28.

Following steps 116 to 118 are the steps for a replacement gate (RPG) process in which the dummy gate electrodes 282 and the dummy gate dielectrics 281 of the dummy gate stacks 28 shown in FIG. 30 are replaced.

Figure 31:
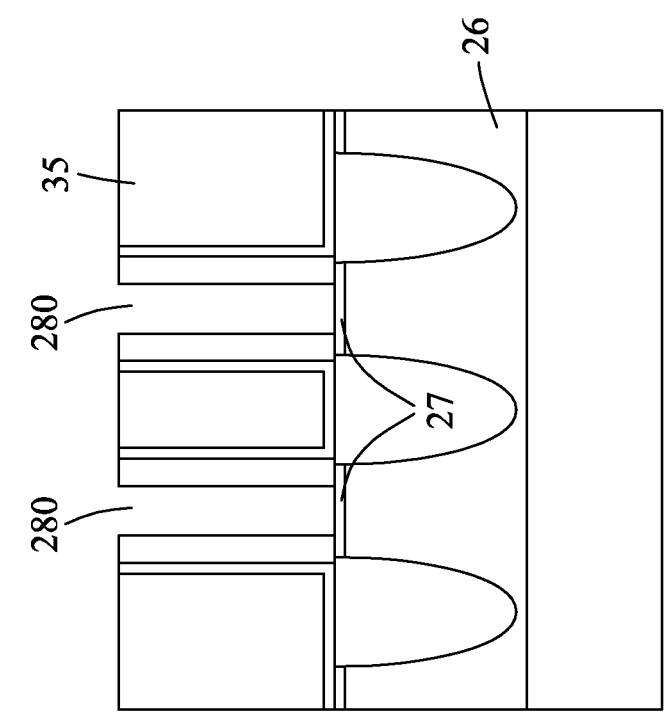

Referring to FIGS. 1B and 31, the method 100 proceeds to step 116, where the dummy gate electrodes 282 and the dummy gate dielectrics 281 of the dummy gate stacks 28 shown in FIG. 30 are removed to form recesses 280. Step 116 may be implemented through a known etching process in the art, such as, but not limited to, a dry etching process, a wet etching process, other suitable processes, or combinations thereof. The recesses 280 may be formed to expose the silicon cap layer 27 formed in step 105 (if any). The silicon cap layer 27 may be provided to prevent the semiconductor fin 26 from being damaged in step 116.

Figure 32:
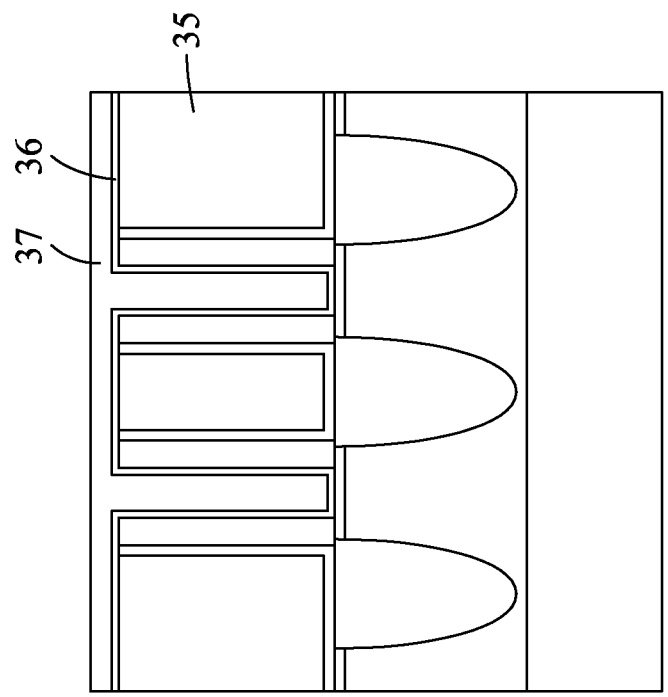

Referring to FIGS. 1B and 32, the method 100 proceeds to step 117, where a gate dielectric layer 36 and a metal filling layer 37 are sequentially formed over the top surface of the ILD layer 35 and to fill in the recesses 280 shown in FIG. 31 through a blanket deposition process using, for example, but not limited to, CVD, HDPCVD, SACVD, MLD, physical vapor deposition (PVD), sputtering, other suitable methods, or combinations thereof. The gate dielectric layer 36 may include, from inner to outer, an interlayer dielectric (which may include, but not limited to, silicon oxide, silicon nitride, silicon oxynitride, other suitable materials, or combinations thereof) and a layer of a high dielectric constant (k) material or other suitable materials. The metal filling layer 37 may include, from inner to outer, a barrier layer (not shown), a work function layer (not shown), and a filling material layer (not shown). The barrier layer is provided to prevent diffusion of a metal into the gate dielectric layer 36. For an n-type FinFET, the work function layer may include, but not limited to, titanium, aluminum, tantalum carbide, tantalum carbide nitride, tantalum silicon nitride, other suitable materials, or combinations thereof. For a p-type FinFET, the work function layer may include, but not limited to, titanium nitride, tantalum nitride, ruthenium, molybdenum, tungsten, platinum, other suitable materials, or combinations thereof. The filling material layer may include, but not limited to, aluminum, tungsten, copper, other suitable materials, or combinations thereof.

Figure 33:
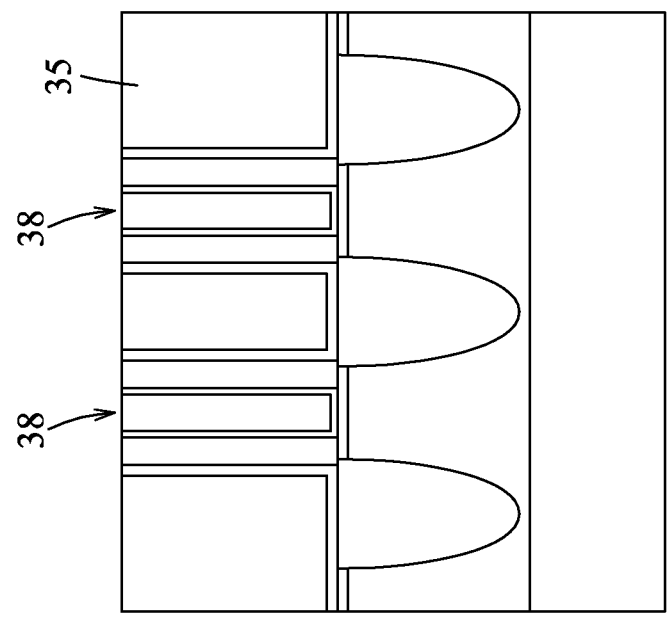

Referring to FIGS. 1B and 33, the method 100 proceeds to step 118, where a planarization process is performed using, for example, but not limited to, CMP, other suitable methods, or combinations thereof, to form metal gates 38 in the recesses 280 shown in FIG. 31. Each of the metal gates 38 includes a portion of the gate dielectric layer 36 and a portion of the metal filling layer 37 shown in FIG. 32. Top surfaces of the metal gates 38 are leveled with a top surface of the ILD layer 35.

Figure 34:
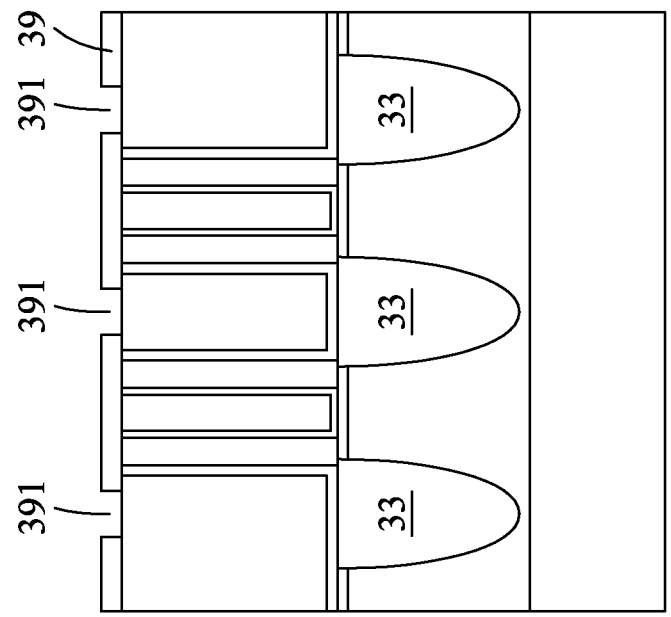

Referring to FIGS. 1B and 34, the method 100 proceeds to step 119, where a photoresist 39 is applied and patterned to cover the semiconductor structure obtained in step 118, and to have openings 391 which are located in positions corresponding to the source-drain regions 33. In some embodiments, the patterned photoresist 39 may be replaced by a patterned hard mask.

Figure 35:
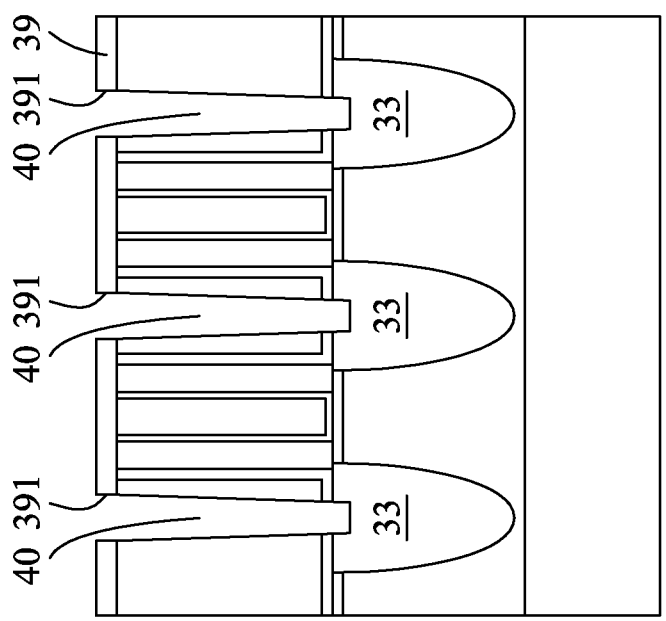

Referring to FIGS. 1B and 35, the method 100 proceeds to step 120, where the ILD layer 35 and the CESL 34 are etched through the openings 391 of the patterned photoresist 39 to form recesses 40. The recesses 40 are formed to expose the source-drain regions 33. Step 120 may be implemented using a known process in the art, such as, but not limited to, a dry etching process, a wet etching process, other suitable processes, or combinations thereof. After step 120, the patterned photoresist 39 may be removed.

Figure 36:
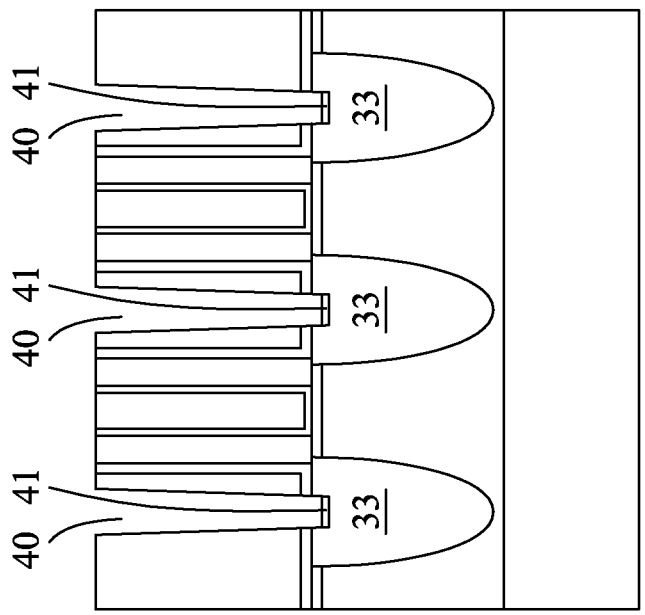

Referring to FIGS. 1B and 36, the method 100 proceeds to step 121, where silicide layers 41 are respectively formed on the source-drain regions 33 exposed from the recesses 40. The silicide layers 41 may include silicon and at least one metallic element, for example, but not limited to, Al, Ti, Ta, other suitable materials, or combinations thereof.

Figure 37:
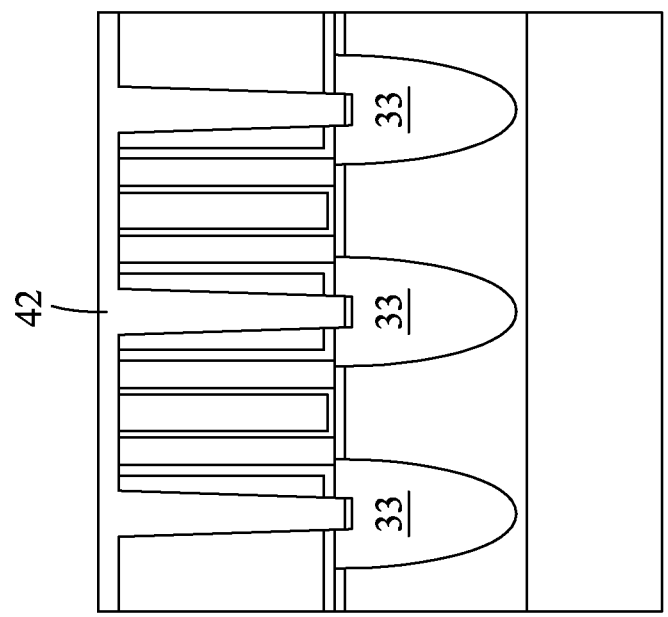

Referring to FIGS. 1B and 37, the method 100 proceeds to step 122, where a layer of metal material 42 is applied on the semiconductor structure obtained in step 121 to fill in the recesses 40 shown in FIG. 36 using, for example, but not limited to, PVD, sputtering, or other suitable methods. The metal material layer 42 may include a barrier layer (not shown) and a conductive bulk layer (not shown). The barrier layer may include Al, Ti, Ta, other suitable materials, or combinations thereof, and may be provided to prevent diffusion of the materials in the conductive bulk layer into the source-drain regions 33. The conductive bulk layer may include a conductive material such as, but not limited to, Co, Cu, Ru, W, other suitable materials, or combinations thereof.

Figure 38:
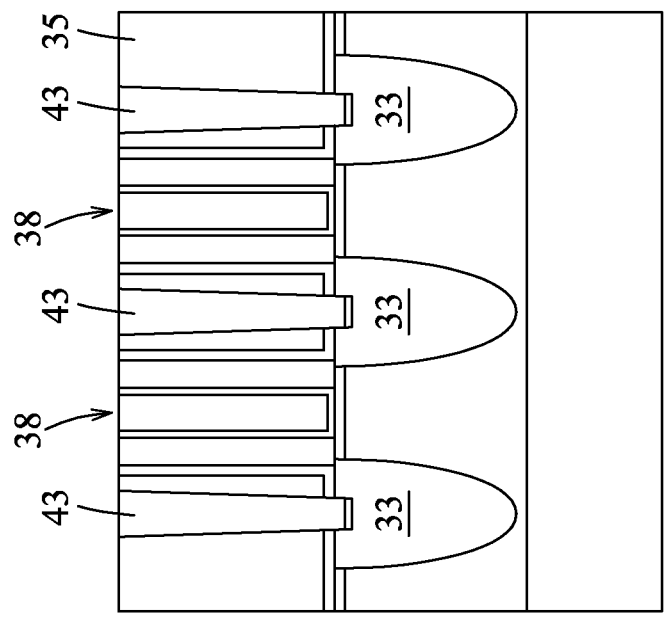

Referring to FIGS. 1B and 38, the method 100 proceeds to step 123 where a planarization process is performed using, for example, but not limited to, CMP, other suitable methods, or combinations thereof, to remove excess of the metal material layer 42 shown in FIG. 37 and to expose the ILD layer 35 and the top surfaces of the metal gates 38. After step 123, the metal material layer 42 is formed into a plurality of metal plugs 43. In subsequent processes, each of the source-drain regions 33 may be electrically connected to an outer metal wiring (not shown) through a respective one of the metal plugs 43. The metal plugs 43 may be referred to as "metal-to-device (MD) contacts" for serving as contacts to conductive regions of the semiconductor structure, for example, the source-drain regions 33.

In alternative embodiments, additional features may be added in the semiconductor structure obtained in step 123, and some features in the semiconductor structure obtained in step 123 may be modified, replaced, or eliminated based on the design of the product to be produced.

In this disclosure, prior to growing the source-drain regions 33 in the recesses 31 of the semiconductor structure, three steps 109 to 111 (i.e., steps of forming the intentional oxide layers 32, treating using the hydrogen radicals, and removing the intentional oxide layers 32) are provided to permit the "proximity push" and the "sidewall push" of the recesses 31 (i.e., the recesses may have widen dimensions in both the X and Y directions) and to permit the recesses 31 to have smooth interior surfaces. Because the recesses 31 may have the smooth interior surfaces for facilitating the growth of the source-drain regions 33, the semiconductor structure obtained by the method 100 may have an improved yield and an improved performance (for, example, a reduced DIBL). Because the recesses 31 may have the widen dimensions in both the X and Y directions, the volume of each of the source-drain regions 33 may be also enlarged, and the semiconductor structure obtained by the method 100 may have an improved drive current (DC).

In accordance with some embodiments of the present disclosure, a method for smoothing a surface of a semiconductor portion of a semiconductor structure includes: forming an intentional oxide layer on the surface of the semiconductor portion; forming a treated layer in the semiconductor portion and inwardly of the intentional oxide layer; and removing the intentional oxide layer and the treated layer so as to permit the semiconductor portion to have a smoothed surface In accordance with some embodiments of the present disclosure, a method for manufacturing a semiconductor structure includes: forming a recess in an exposed region of a semiconductor portion; forming an intentional oxide layer on an interior surface of the recess; forming a treated layer in the semiconductor portion and inwardly of the intentional oxide layer; and removing the intentional oxide layer and the treated layer so as to widen the recess.

In accordance with some embodiments of the present disclosure, a semiconductor structure includes: a semiconductor portion having a channel region and two source-drain regions; and two sidewalls formed on two opposite sides of each of the source-drain regions, and spaced apart from each other by a distance larger than a width of the channel region.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for smoothing a surface of a semiconductor portion of a semiconductor structure, comprising:
   forming an intentional oxide layer on the surface of the semiconductor portion;
   forming a treated layer in the semiconductor portion and inwardly of the intentional oxide layer; and
   removing the intentional oxide layer and the treated layer so as to permit the semiconductor portion to have a smoothed surface,
   wherein the intentional oxide layer is formed without using a wet etchant for removing an oxide material, and the treated layer is formed immediately after formation of the intentional oxide layer.

2. The method of claim 1, wherein the treated layer is formed by applying free radicals to penetrate the intentional oxide layer and to attack the semiconductor portion.

3. The method of claim 2, wherein the free radicals include hydrogen radicals.

4. The method of claim 1, wherein the intentional oxide layer has a thickness not greater than 10 Å.

5. The method of claim 1, wherein the intentional oxide layer is formed using a natural oxidation process, an oxygen treatment process, an ozone treatment process, a chemical oxidation process, a thermal chemical vapor deposition process, a thermal oxidation process, or combinations thereof.

6. The method of claim 1, wherein removing the intentional oxide layer and the treated layer is implemented using an HF vapor etching, an $NH_3$ vapor etching, an $NH_3$ plasma etching, an $NF_3$ vapor etching, an $NF_3$ plasma etching, a wet diluted HF etching, or combinations thereof.

7. A method for manufacturing a semiconductor structure, comprising:
   forming a recess in an exposed region of a semiconductor portion;
   forming an intentional oxide layer on an interior surface of the recess;
   forming a treated layer in the semiconductor portion and inwardly of the intentional oxide layer; and
   removing the intentional oxide layer and the treated layer so as to widen the recess,
   wherein the intentional oxide layer is formed without using a wet etchant for removing an oxide material, and the treated layer is formed immediately after formation of the intentional oxide layer.

8. The method of claim 7, wherein the treated layer are formed by applying free radicals to penetrate the intentional oxide layer and to attack the semiconductor portion.

9. The method of claim 7, wherein the free radicals include hydrogen radicals.

10. The method of claim 7, wherein the intentional oxide layer has a thickness not greater than 10 Å.

11. The method of claim 7, further comprising:
   forming a gate stack over the semiconductor portion;
   forming two gate spacers on two opposite sides of the gate stack such that the exposed region of the semiconductor portion is exposed from the gate stack and the gate spacers; and
   forming two sidewall spacers on two opposite sides of the exposed region of the semiconductor portion.

12. The method of claim 11, wherein the gate spacers are opposite to each other in an X direction, and the sidewall spacers are opposite to each other in a Y direction that is transverse to the X direction.

13. The method of claim 12, wherein the recess is widened in the X direction after removing the intentional oxide layer and the treated layer.

14. The method of claim 12, wherein during removal of the intentional oxide layer and the treated layer, inner wall layers of the sidewall spacers are removed simultaneously.

15. The method of claim 14, wherein the recess is widened in the Y direction after removing the inner wall layers.

16. The method of claim 11, wherein a reference plane is defined by an outer surface of each of the gate spacers, and the recess is widened over the reference plane by a distance which ranges from 0 nm to 0.5 nm.

17. The method of claim 14, wherein a removed thickness of each of the inner wall layers ranges from 0 nm to 0.5 nm.

18. A method for manufacturing a semiconductor structure, comprising:
   forming a semiconductor fin which is elongated in an X direction, and which has a width in a Y direction transverse to the X direction;
   forming a gate structure over the semiconductor fin, the gate structure being elongated in the Y direction such that the semiconductor fin has two exposed regions which are exposed from and at two opposite sides of the gate structure;
   forming sidewall spacers on two opposite sides of each of the exposed regions of the semiconductor fin;
   forming two recesses respectively in the exposed regions;
   forming two intentional oxide layers respectively on interior surfaces of the recesses;
   applying free radicals into the semiconductor fin through the intentional oxide layers so as to form two treated layers which are respectively located inwardly of the intentional oxide layers;
   removing the intentional oxide layers and the treated layers so as to widen each of the recesses in the X direction; and
   forming two source-drain regions respectively in the widened recesses,
   wherein the intentional oxide layers are formed without using a wet etchant for removing an oxide material, and the free radicals for forming the treated layers are applied immediately after formation of the intentional oxide layers.

19. The method of claim 18, wherein the semiconductor fin has a channel length between the source-drain regions in the X direction, and the gate structure has a gate length in the X direction, the channel length being smaller than the gate length.

20. The method of claim 18,
   wherein during removal of the intentional oxide layers and the treated layers, inner wall layers of the sidewall spacers are removed simultaneously such that each of the widened recesses has a largest dimension in the Y direction, which is larger than the width of the semiconductor fin.

* * * * *